United States Patent
Yun et al.

(10) Patent No.: US 11,303,021 B2
(45) Date of Patent: Apr. 12, 2022

(54) DUAL-BAND ANTENNA USING COUPLING FEEDING AND ELECTRONIC DEVICE INCLUDING THE SAME

(71) Applicant: Samsung Electronics Co., Ltd., Gyeonggi-do (KR)

(72) Inventors: Sumin Yun, Gyeonggi-do (KR); Sehyun Park, Gyeonggi-do (KR); Myunghun Jeong, Gyeonggi-do (KR); Jehun Jong, Gyeonggi-do (KR); Jae Hoon Jo, Gyeonggi-do (KR); Jinwoo Jung, Gyeonggi-do (KR); Jae-Bong Chun, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 415 days.

(21) Appl. No.: 16/200,816

(22) Filed: Nov. 27, 2018

(65) Prior Publication Data

US 2019/0165472 A1     May 30, 2019

(30) Foreign Application Priority Data

Nov. 28, 2017  (KR) .......................... 10-2017-0161064

(51) Int. Cl.
   *H01Q 5/10*     (2015.01)
   *H01Q 1/24*     (2006.01)
   (Continued)

(52) U.S. Cl.
   CPC .............. *H01Q 5/10* (2015.01); *H01Q 1/242* (2013.01); *H01Q 1/243* (2013.01); *H01Q 1/48* (2013.01);
   (Continued)

(58) Field of Classification Search
   CPC ............ H01Q 5/10; H01Q 21/28; H01Q 5/40; H01Q 21/08; H01Q 21/24; H01Q 1/243;
   (Continued)

(56) References Cited

U.S. PATENT DOCUMENTS 5,005,019 A    4/1991  Zaghloul et al.
6,091,373 A    7/2000  Raguenet
(Continued)

FOREIGN PATENT DOCUMENTS

CN      1601807 A    3/2005
CN      2706884 Y    6/2005
(Continued)

OTHER PUBLICATIONS

Machine translation of Applicant cited KR 10-2014-0134452A on IDS filed Nov. 27, 2018 (Year: 2014).*
(Continued)

*Primary Examiner* — Dimary S Lopez Cruz
*Assistant Examiner* — Michael M Bouizza
(74) *Attorney, Agent, or Firm* — Cha & Reiter, LLC.

(57) ABSTRACT

According to an embodiment, an electronic device comprises a housing comprising a first plate and a second plate facing away from to the first plate; and a substrate disposed between the first plate and the second plate and comprising a first side facing the first plate and a second side facing the second plate, wherein the substrate comprises, a first conductive plate disposed on a first insulating layers and facing the second side; a conductive pattern disposed on a second insulating layer, wherein the second conductive layer is between the first conductive layer and the first side; a second conductive plate disposed on a third insulating layer between the second insulating layer and the first side, and when the second plate is viewed from above the second side, the second plate at least partially overlaps with the first
(Continued)

conductive plate; a ground plate disposed on a fourth insulating layer, wherein the fourth insulating layer is between the third insulating layer and the first side; a conductive via constructed through the third and fourth insulating layers, and electrically connected with the conductive pattern; and a wireless communication circuit electrically connected with the conductive via, and configured to transmit/receive at least one signal having a frequency band in the range of 20 GHz to 100 GHz.

20 Claims, 27 Drawing Sheets

(51) Int. Cl.
| | |
|---|---|
| *H01Q 1/48* | (2006.01) |
| *H01Q 21/10* | (2006.01) |
| *H01Q 9/04* | (2006.01) |
| *H05K 1/11* | (2006.01) |
| *H04B 1/40* | (2015.01) |
| *H04B 1/00* | (2006.01) |
| *H05K 1/02* | (2006.01) |
| *H01Q 21/28* | (2006.01) |
| *H04B 1/3888* | (2015.01) |
| *H01Q 5/40* | (2015.01) |
| *H01Q 21/08* | (2006.01) |
| *H01Q 21/24* | (2006.01) |

(52) U.S. Cl.
CPC ............ *H01Q 5/40* (2015.01); *H01Q 9/0407* (2013.01); *H01Q 9/0414* (2013.01); *H01Q 9/0421* (2013.01); *H01Q 9/0457* (2013.01); *H01Q 21/08* (2013.01); *H01Q 21/10* (2013.01); *H01Q 21/24* (2013.01); *H01Q 21/28* (2013.01); *H04B 1/0053* (2013.01); *H04B 1/0067* (2013.01); *H04B 1/3888* (2013.01); *H04B 1/40* (2013.01); *H05K 1/0243* (2013.01); *H05K 1/115* (2013.01); *H05K 2201/10098* (2013.01)

(58) Field of Classification Search
CPC .. H01Q 9/0421; H01Q 9/0457; H01Q 9/0414; H01Q 9/0407; H01Q 1/242; H01Q 1/48; H01Q 21/10; H01Q 1/38; H01Q 1/46; H04B 1/3888; H04B 1/40; H04B 1/0053; H04B 1/0067; H05K 1/115; H05K 1/0243; H05K 2201/10098; H05K 1/0251; H04M 1/0249; H04M 1/0277
See application file for complete search history.

(56) References Cited

U.S. PATENT DOCUMENTS

| | | |
|---|---|---|
| 10,756,420 B2 | 8/2020 | Kosaka |
| 2005/0190106 A1* | 9/2005 | Anguera Pros .......... H01Q 1/36 343/700 MS |
| 2005/0200528 A1 | 9/2005 | Carrender et al. |
| 2006/0109177 A1 | 5/2006 | Prieto-Burgos et al. |
| 2007/0216589 A1 | 9/2007 | Li et al. |
| 2008/0048917 A1 | 2/2008 | Achour et al. |
| 2009/0058731 A1 | 3/2009 | Geary et al. |
| 2011/0050533 A1* | 3/2011 | Cho ....................... H01Q 1/243 343/848 |
| 2012/0280380 A1 | 11/2012 | Kamgaing |
| 2014/0256273 A1 | 9/2014 | Pelosi et al. |
| 2015/0091760 A1* | 4/2015 | Sawa ..................... H01Q 5/385 343/700 MS |
| 2016/0190697 A1 | 6/2016 | Preradovic et al. |
| 2016/0233178 A1* | 8/2016 | Lamy ................. H01L 21/4846 |
| 2017/0125919 A1 | 5/2017 | Chien et al. |
| 2017/0271764 A1 | 9/2017 | Gabriel et al. |

FOREIGN PATENT DOCUMENTS

| | | |
|---|---|---|
| CN | 106848602 A | 6/2017 |
| GB | 2046530 A | 11/1980 |
| KR | 10-2009-0130922 A | 12/2009 |
| KR | 10-2014-0134452 A | 11/2014 |
| WO | 2016/159369 A1 | 10/2016 |

OTHER PUBLICATIONS

International Search Report dated Mar. 6, 2019.
European Search Report dated Nov. 11, 2020.
Chinese Search Report dated Nov. 30, 2020.
Chinese Search Report dated Aug. 4, 2021.
Korean Search Report dated Oct. 19, 2021.
Indian Search Report dated May 23, 2021.
Chen et al., "Design Application of Broadband Planar Antennas"; Dec. 31, 2015; pp. 131-134.
Chinese Search Report dated Nov. 2, 2021.

* cited by examiner

US 11,303,021 B2

DUAL-BAND ANTENNA USING COUPLING FEEDING AND ELECTRONIC DEVICE INCLUDING THE SAME

CLAIM OF PRIORITY

This application claims the benefit under 35 U.S.C. § 119(a) of a Korean patent application filed in the Korean Intellectual Property Office on Nov. 28, 2017 and assigned Serial No. 10-2017-0161064, the entire disclosure of which is hereby incorporated by reference.

BACKGROUND

1. Field of the Invention

Various embodiments of the present disclosure relate to a dual-band antenna using coupling feeding, and an electronic device including the dual-band antenna.

2. Description of the Related Art

With the development of wireless communication technologies, electronic devices (e.g., communication electronic devices) are widely used in everyday life, and thus the use of content increases exponentially. Due to the rapid increase in the use of the content, the usage of the network is approaching capacity. As low latency data communication is required, there is on-going development in a next generation wireless communication technology (e.g., $5^{th}$ Generation (5G) communication) or a high-speed wireless communication technology such as Wireless Gigabit alliance (WIGIG) (e.g., 802.11AD) or the like.

SUMMARY

Next-generation wireless communication technologies may use signals with wavelengths on the order of millimeters having a frequency substantially greater than or equal to 20 GHz, and for example, may be used simultaneously in a band of 28 GHz and a band of 39 GHz. Therefore, when a single antenna supporting a dual-band is mounted inside an electronic device with a smaller size, it may be effective in terms of space utilization of the electronic device.

In recent years, a conductive patch antenna may be used for a dual-band with the single antenna. For example, the patch-type antenna may be implemented to operate in the dual-band by comprising a specific length and slot as a parasitic element in the conductive patch. However, since the parasitic element (e.g., slot) is constructed on the patch, the patch-type antenna changes to have an asymmetric structure, and thus it may be difficult to implement dual polarization. In addition, a dual-band antenna may be implemented by allowing patches operating in different bands to be adjacent to each other. However, since the antenna is implemented separately, an overall size of the antenna may be increased.

Certain embodiments of the present disclosure may provide a dual-band antenna using coupling feeding, and an electronic device including the dual-band antenna.

Certain embodiments of the present disclosure may provide a dual-band antenna using coupling feeding configured to support dual polarization by implementing a dual band without having to change a shape of a conductive plate, and an electronic device including the dual-band antenna.

Certain embodiments of the present disclosure may provide a dual-band antenna using coupling feeding capable of providing an efficient mounting space, and an electronic device including the dual-band antenna.

According to certain embodiments, an electronic device comprises a housing comprising a first plate and a second plate facing away from to the first plate; and a substrate disposed between the first plate and the second plate and comprising a first side facing the first plate and a second side facing the second plate, wherein the substrate comprises, a first conductive plate disposed on a first insulating layers and facing the second side; a conductive pattern disposed on a second insulating layer, wherein the second conductive layer is between the first conductive layer and the first side; a second conductive plate disposed on a third insulating layer between the second insulating layer and the first side, and when the second plate is viewed from above the second side, the second plate at least partially overlaps with the first conductive plate; a ground plate disposed on a fourth insulating layer, wherein the fourth insulating layer is between the third insulating layer and the first side; a conductive via constructed through the third and fourth insulating layers, and electrically connected with the conductive pattern; and a wireless communication circuit electrically connected with the conductive via, and configured to transmit/receive at least one signal having a frequency band in the range of 20 GHz to 100 GHz.

According to certain embodiments, an electronic device comprises a housing comprising a first plate, a second plate facing away from the first plate, and a lateral member surrounding a space between the first plate and the second plate; a Printed Circuit Board (PCB) disposed between the first plate and the second plate, and comprising a plurality of insulating layers disposed in parallel with the second plate; a first conductive plate disposed on a first one of the plurality of insulating layers of the PCB; a second conductive plate overlapping with the first conductive plate, when the second plate is viewed from above the second plate, and disposed on a third one of the plurality of insulating layers of the substrate; a first conductive coupling member disposed on a second one of the plurality of insulating layers between the first conductive plate and the second conductive plate; and a wireless communication circuit electrically connected with the first conductive coupling member configured to provide wireless communication.

An antenna according to certain embodiments of the present disclosure can provide an efficient mounting space by using coupling feeding between two conductive plates via a conductive coupling member, and can ensure a freedom in designing of a conductive plate used as a radiator to support dual polarization while operating in a dual band without having to change a shape of the conductive plate.

DETAILED DESCRIPTION

Figure 1:
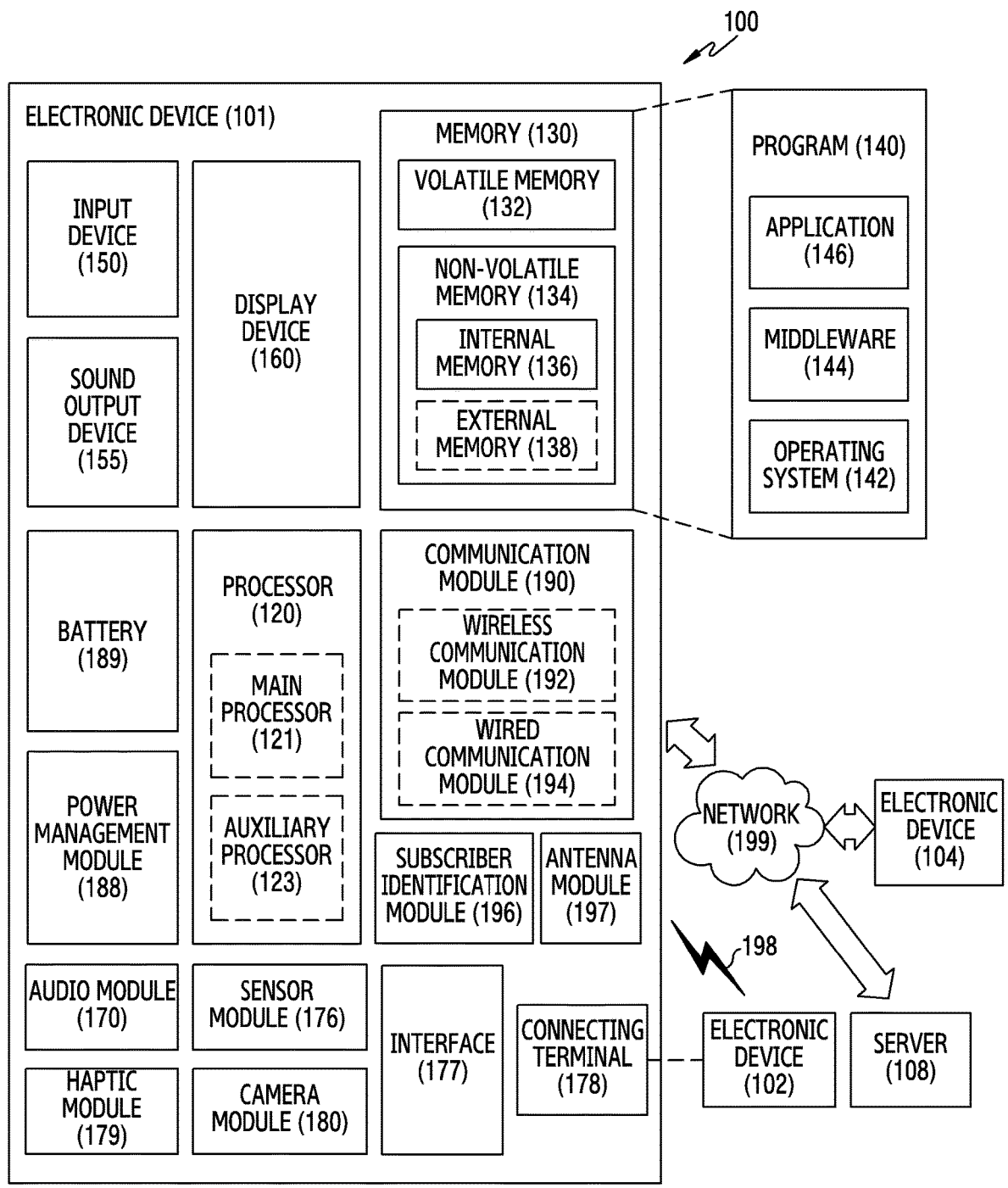
FIG. 1 is a block diagram illustrating an electronic device in a network environment according to certain embodiments of the present disclosure.

FIG. 1 is a block diagram illustrating an electronic device in a network environment according to certain embodiments of the present disclosure.

Referring to FIG. 1, an electronic device 101 in the network environment may communicate with an electronic device 102 via a first network 198 (e.g., short-range wireless communication), or an electronic device 104 or a server 108 via a second network 199 (e.g., long-range wireless communication). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a Subscriber Identification Module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented in an integrated manner, for example, as in a case of the sensor module 176 (e.g., a fingerprint sensor, an iris sensor, or an illuminance sensor) embedded in the display device 160 (e.g., a display).

The processor 120 may drive, for example, software (e.g., a program 140) to control at least one other component (e.g., a hardware or software component) of the electronic device 101 coupled with the processor 120, and may perform various data processing or computation. The processor 120 may load a command or data received from other components (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a Central Processing Unit (CPU) or an Application Processor (AP)), and an auxiliary processor 123 (e.g., a Graphics Processing Unit (GPU), an Image Signal Processor (ISP), a sensor hub processor, or a Communication Processor (CP)) that is operable independently from, or in conjunction with, the main processor 121. Additionally or alternatively, the auxiliary processor 123 may be adapted to consume less power than the main processor 121, or to be specific to a specified function. Herein, the auxiliary processor 123 may be implemented as separate from, or imbedded in the main processor 121.

In this case, the auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data, for example, software (e.g., the program 140) and input data or output data for a command related thereto, used by at least one component (e.g., the processor 120 or the sensor module 176) of the electronic device 101. The memory 130 may include the volatile memory 132 or the non-volatile memory 134.

The program 140 may be stored in the memory 130 as software, and may include, for example, an Operating System (OS) 142, middleware 144, or an application 146.

The input device 150 may be a device for receiving a command or data to be used by a component (e.g., the processor 120) of the electronic device 101 from the outside (e.g., a user) of the electronic device 101, and may include, for example, a microphone, a mouse, or a keyboard.

The sound output device 155 may be a device for outputting sound signals to the outside of the electronic device 101, and may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may be a device for visually provide information to a user of the electronic device 101, and may include, for example, a display, a hologram device, or a projector and control circuitry to control a corresponding device. According to an embodiment, the display device 160 may include touch circuitry or a pressure sensor adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or, for example, an external electronic device (e.g., an electronic device 102, for example, a speaker or a headphone)) wiredly or wirelessly coupled with the electronic device 101.

The sensor module 176 may generate an electrical signal or data value corresponding to an internal operational state (e.g., power or temperature) of the electronic device 101 or an external environmental state. The sensor module 176 may include, for example, a gesture sensor, a gyro sensor, an atmospheric pressure sensor, a magnetic sensor, an acceleration sensor, a grip sensor, a proximity sensor, a color sensor, an Infrared (IR) sensor, a biometric sensor, a temperature sensor, a humidity sensor, or an illuminance sensor.

The interface 177 may support a specified protocol to be coupled with the external electronic device (e.g., the electronic device 102) wiredly or wirelessly. According to an embodiment, the interface 177 may include, for example, a High Definition Multimedia Interface (HDMI), a Universal Serial Bus (USB) interface, a Secure Digital (SD) card interface, or an audio interface.

A connection terminal 178 may include a connector via which the electronic device 101 may be physically connected with the external electronic device (e.g., the electronic device 102), and may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via tactile sensation or kinesthetic sensation. The haptic module 179 may include, for example, a motor, a piezoelectric element, or an electric stimulator.

The camera module 180 may capture still images or moving images. According to an embodiment, the camera module 180 may include one or more lenses, image sensors, image signal processors, or flashes.

The power management module 188 may be a module for managing power supplied to the electronic device 101, and may be implemented as at least part of, for example, a Power Management Integrated Circuit (PMIC).

The battery 189 may be a device for supplying power to at least one component of the electronic device 101, and may include, for example, a primary cell which is not rechargeable, a secondary cell which is rechargeable, or a fuel cell.

The communication module 190 may support establishing a wired communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the Application Processor (AP)) and supports a wired communication or a wireless communication. According to an embodiment, the communication module 190 may include a wireless communication module 192 (e.g., a cellular communication module, a short-range wireless communication module, or a Global Navigation Satellite System (GNSS) communication module) or a wired communication module 194 (e.g., a Local Area Network (LAN) communication module or a Power Line Communication (PLC) module). A corresponding one of these communication modules may communicate with the external electronic device via the first network 198 (e.g., a short-range communication network, such as Bluetooth™, Wireless-Fidelity (Wi-Fi) direct, or Infrared Data Association (IrDA)) or the second network 199 (e.g., a long-range communication network, such as a cellular network, the Internet, or a computer network (e.g., LAN or Wide Area Network (WAN)). These various types of the communication modules 190 may be implemented as a single chip, or may be implemented as chips separate from each other.

According to an embodiment, the wireless communication module 192 may identify and authenticate the electronic device 101 in a communication network by using user information stored in the subscriber identification module 196.

The antenna module 197 may include one or more antennas for transmitting or receiving a signal or power to or from the outside. According to an embodiment, the communication module 190 (e.g., the wireless communication module 192) may transmit or receive a signal to or from the external electronic device via an antenna appropriate for a communication scheme.

At least some of the above-described components may be coupled mutually and communicate signals (e.g., commands or data) therebetween via an inter-peripheral communication scheme (e.g., a bus, General Purpose Input and Output (GPIO), Serial Peripheral Interface (SPI), or Mobile Industry Processor Interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type from, the electronic device 101. According to an embodiment, all or some of operations to be executed at the electronic device 101 may be executed at one or more of the external electronic devices. According to an embodiment, if the electronic device 101 should perform a function or a service automatically, or in response to a request, the electronic device 101, instead of, or in addition to, executing the function or the service, may request the one or more external electronic devices to perform at least part of the function or the service. The external electronic devices receiving the request may perform the requested function or an additional function, and transfer an outcome of the performing to the electronic device 101. The electronic device 101 may provide the requested function or service, with or without further processing of the outcome. To that end, a cloud computing, for example, distributed computing, or client-server computing technology may be used.

The electronic device according to certain embodiments disclosed in the present document may be one of various types of electronic devices. The electronic devices may include, for example, a portable communication device (e.g., a smart phone), a computer device, a portable multimedia device, a portable medical device, a camera, a wearable device, or a home appliance. According to an embodiment of the document, the electronic device is not limited to the aforementioned devices.

It should be appreciated that certain embodiments of the present document and the terms used therein are not intended to limit the technological features set forth herein to particular embodiments and include various changes, equivalents, or replacements for a corresponding embodiment. With regard to the description of the drawings, similar reference numerals may be used to refer to similar or related elements. A singular expression may include a plural expression unless there is a contextually distinctive difference. In the present document, expressions such as "A or B", "at least one of A and/or B", "A, B, or C", or "at least one of A, B, and/or C" may include all possible combinations of items enumerated together. Expressions such as "$1^{st}$" and "$2^{nd}$" or "first" and "second" may be used to simply distinguish a corresponding component from another, and does not limit the component in other aspect (e.g., importance or order). When a certain (e.g., $1^{st}$) component is mentioned as being "operatively or communicatively coupled with/to" or "connected to" a different (e.g., $2^{nd}$) component, the certain component is directly coupled with/to another component or can be coupled with/to the different component via another (e.g., $3^{rd}$) component.

As used herein, the term "module" may include a unit implemented in hardware, software, or firmware, and may interchangeably be used with other terms, for example, "logic", "logic block", "component", or "circuitry". The module may be a single integral component, or a minimum unit or part thereof, adapted to perform one or more functions. For example, the module may be implemented with an Application-Specific Integrated Circuit (ASIC).

Certain embodiments of the present document may be implemented as software (e.g., the program 140) including instructions that are stored a storage medium (e.g., the internal memory 136 or the external memory 138) that is readable by a machine (e.g., a computer). The machine may include an electronic device (e.g., the electronic device 101) according to the disclosure embodiments, as a device which invokes the stored instructions from the medium and is operable according to the instruction invoked. When the instruction is executed by a processor (e.g., the processor 120), the processor may perform a function corresponding to the instruction by using other components directly or under the control of the processor. The instruction may include a code generated or executed by a complier or an interpreter. The machine-readable storage medium may be provided in the form of a non-transitory storage medium. Herein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to certain embodiments of the document may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) according to certain embodiments may include a single entity or multiple entities. According to certain embodiments, some of the above-described sub components may be omitted, or other sub components may be further included. Alternatively or additionally, some components (e.g., modules or programs) may be integrated into a single entity, and thus may perform functions in the same or similar manner as they are performed by corresponding respective components before the integration. According to certain embodiments, operations performed by the module, the program, or another component may be carried out sequentially, in parallel, repeatedly, or heuristically, or at least some operations may be executed in a different order or omitted, or other operations may be added.

Figure 2A:
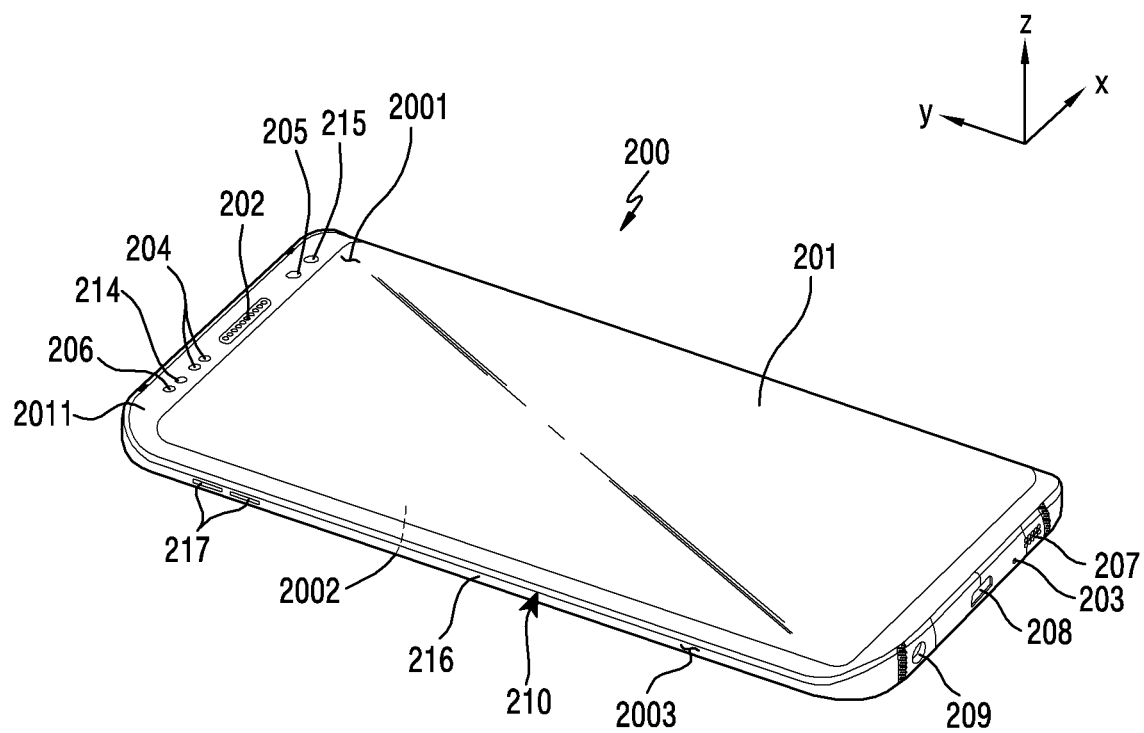
FIG. 2A and FIG. 2B are perspective views of an electronic device according to certain embodiments of the present disclosure.
Figure 2B:
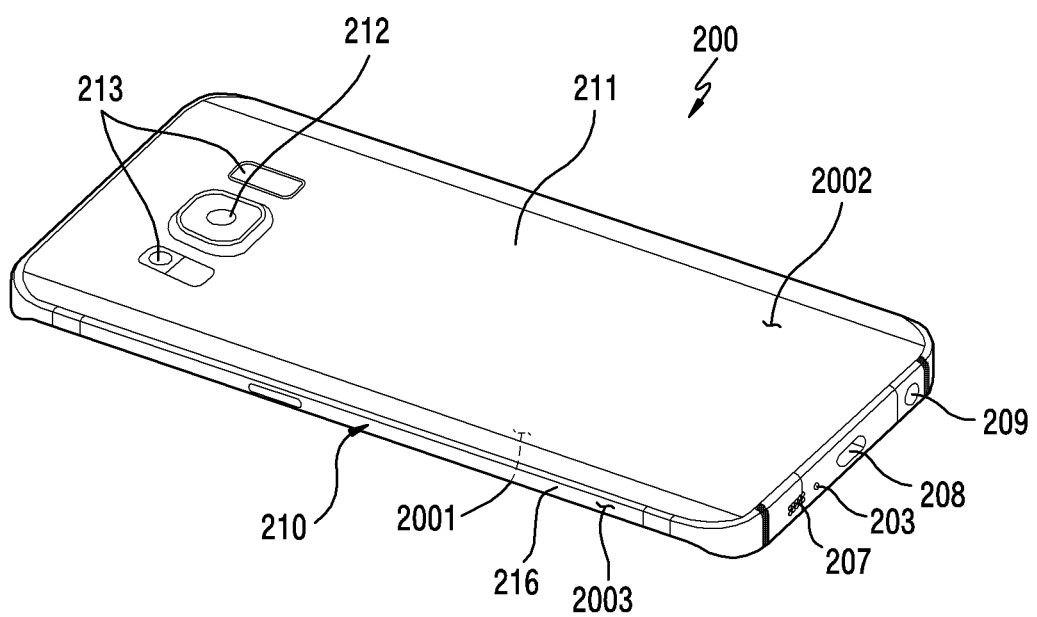

FIG. 2A and FIG. 2B are perspective views of an electronic device according to certain embodiments of the present disclosure.

FIG. 2A may be a front perspective view of an electronic device, and FIG. 2B may be a rear perspective view of the electronic device.

An electronic device 200 of FIG. 2A and FIG. 2B may be at least partially similar to the electronic device 101 of FIG. 1, or may include other embodiments of the electronic device.

Referring to FIG. 2A and FIG. 2B, an electronic device 200 (e.g., the electronic device 100) may include a housing 210. According to an embodiment, the housing 210 may be constructed of a conductive member and/or a non-conductive member. According to an embodiment, the housing 210 may include a first side 2001 (e.g., a front side or an upper side) facing a first direction (e.g., a Z-axis direction), a second side 2002 (e.g., a rear side or a lower side) disposed facing away from the first side 2001, and a lateral side 2003 disposed to surround at least part of the first side 2001 and the second side 2002. According to an embodiment, the lateral side 2003 may be coupled with a front plate 2011 (a first plate) and a rear plate 211 (a second plate), and may be constructed based on a lateral member 216 including a metal and/or a polymer. According to an embodiment, the electronic device 200 may include the front plate 2011 (e.g., a window or glass plate) disposed to the first side 2001, and may be disposed such that a display 201 is exposed through the front plate 2011. According to an embodiment, the electronic device 200 may include a communication receiver hole 202. According to an embodiment, the electronic device 200 may be controlled to use a speaker disposed therein to speak with the other party via the communication receiver hole 202. According to an embodiment, the electronic device 200 may include a microphone hole 203. According to an embodiment, the electronic device 200 may use at least one microphone disposed therein and capable of sensing a sound direction, and may receive an external sound through the microphone hole 203 or transmit a user's voice to the other party. According to an embodiment, the electronic device 200 may include at least one key input device 217. According to an embodiment, the key input device 217 may include at least one side key button 217 disposed to the lateral member 216 of the housing 210. According to an embodiment, the at least one side key button 217 may include a volume control button, a wake-up button, or a button for performing a specific function (e.g., a function of executing artificial intelligence, a function of entering a fast speech recognition execution mode, etc.).

According to certain embodiments, the electronic device 200 may include components for performing various functions of the electronic device 200 by being exposed through the display 201 or by being disposed to be obscured through the front plate 2011 while performing a function. According to an embodiment, the components exposed through the display may include at least one sensor module 204. The sensor module 204 may include, for example, an illumination sensor (e.g., an optical sensor), a proximity sensor (e.g., an optical sensor), an infrared sensor, an ultrasonic sensor, a fingerprint sensor, a face recognition sensor, or an iris recognition sensor. According to an embodiment, the component may include a first camera device 205. According to an embodiment, the component may include an indicator 206 (e.g., an LED device) for visually presenting status information of the electronic device 200 to a user. According to an embodiment, the component may include a light source 214 (e.g., an infrared LED) disposed to one side of the receiver 202. According to an embodiment, the component may include an imaging sensor assembly 215 (e.g., an iris camera) to detect an iris image in a state where light generated from the light source 214 is irradiated around a user's eye. According to an embodiment, at least one of these components may be disposed to be exposed through at least some regions of the second side 2002 (e.g., a rear side or a back side) facing a direction (e.g., −Z-axis direction) opposite to a first direction of the electronic device 200.

According to certain embodiments, the electronic device 200 may include an external speaker hole 207. According to an embodiment, the electronic device 200 may use a speaker disposed therein to output a sound through the external speaker hole 207. According to an embodiment, the electronic device 200 may include a first connector hole 208 (e.g., an interface connector port) to charge the electronic device 200 by using a data transmission/reception function and external power provided by an external device. According to an embodiment, the electronic device 200 may include a second connector hole 209 (e.g., an ear jack assembly) to accommodate an ear jack of the external device.

According to certain embodiments, the electronic device 200 may include the rear plate 211 (e.g., a rear window) disposed to the second side 2002. According to an embodiment, a rear camera device 212 may be disposed to the rear plate 211. At least one electronic component 213 may be disposed around the rear camera device 212. According to an embodiment, the electronic component 213 may include at least one of an illumination sensor (e.g., an optical sensor), a proximity sensor (e.g., an optical sensor), an infrared sensor, an ultrasonic sensor, a heartrate sensor, a fingerprint recognition sensor, and a flash device.

According to certain embodiments, the display 201 may include the front plate 2011 disposed to be exposed through at least some regions of the first side 2001 of the electronic device 200. According to an embodiment, the display 201 may include a touch panel and display panel stacked on the rear side of the front plate 2011. According to an embodiment, an image displayed through the display panel may be provided to the user through the front plate 2011 of a transparent material. According to an embodiment, various materials such as transparent glass or acrylic may be used as the front plate 2011.

According to certain embodiments, the electronic device 200 may include at least one communication device (e.g., a communication device 400 of FIG. 4A) which uses a radio waves with wavelengths on the order of millimeters (e.g., a band of at least 20 GHz) as an operating wavelength/frequency band. According to an embodiment, the communication device may include a pair of conductive plates (e.g., conductive plates 421 and 422 of FIG. 4A) disposed in an overlapping manner to be electrically disconnected from a substrate, and a conductive coupling member (e.g., a conductive coupling member 423 of FIG. 4A) disposed to be capacitively fed between them. According to an embodiment, the communication device may contribute to make the electronic device slim since a separate mounting space for implementing a dual-band antenna is excluded by disposing a pair of conductive plates and conductive coupling members to different insulating layers of a substrate (e.g., a substrate 410 of FIG. 4A).

Figure 3:
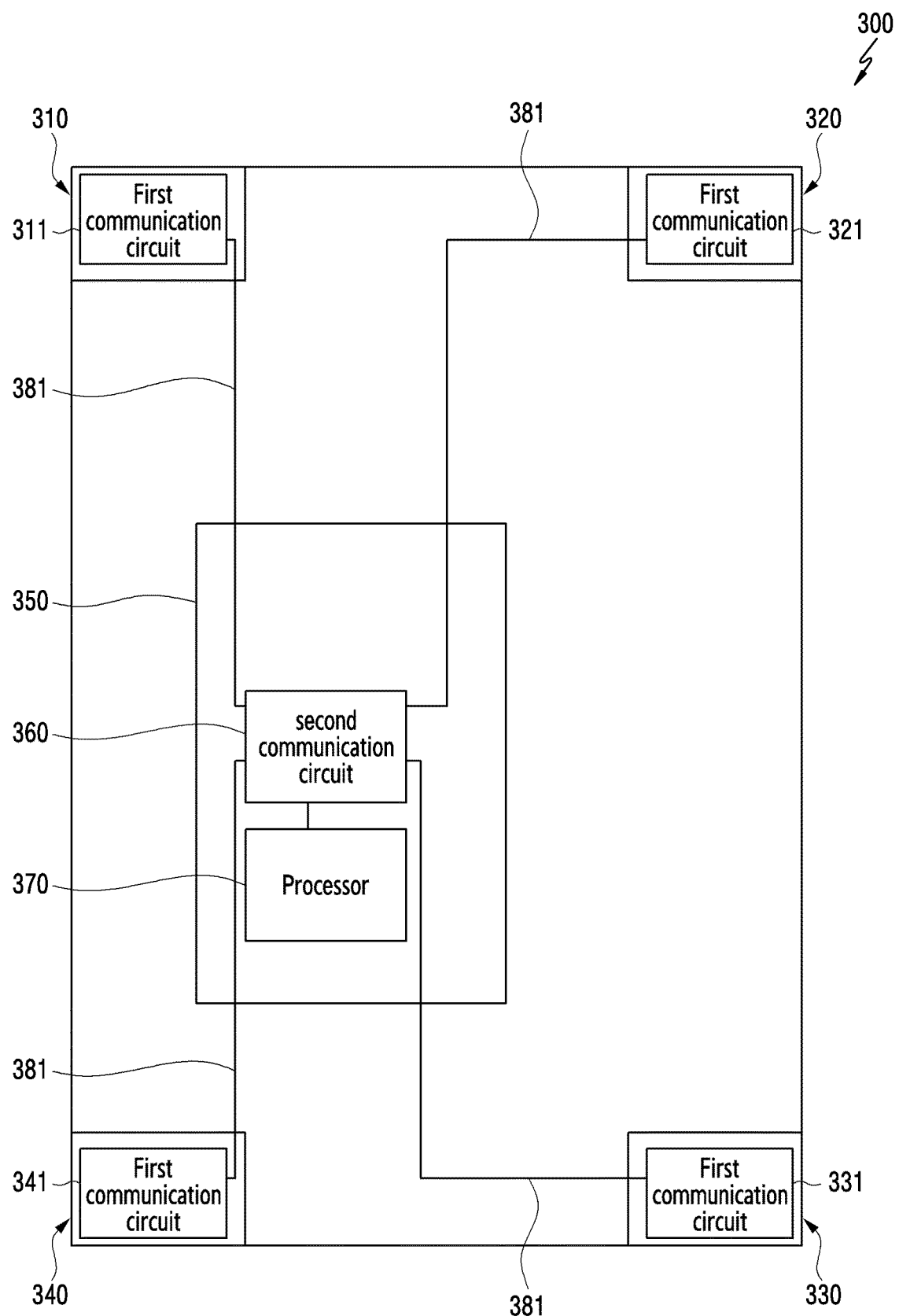
FIG. 3 illustrates a deployment relation of a communication device in an electronic device according to certain embodiments of the present disclosure.

FIG. 3 illustrates a deployment relation of a communication device in an electronic device according to certain embodiments of the present disclosure.

An electronic device 300 of FIG. 3 may be at least partially similar to the electronic device 101 of FIG. 1 or the electronic device 200 of FIG. 2A, or may include other embodiments of the electronic device.

Referring to FIG. 3, the electronic device 300 may include at least one of communication devices 310, 320, 330, and 340. According to an embodiment, the communication devices 310, 320, 330, and 340 may include a pair of conductive plates (e.g., a pair of conductive plates 421 and 422 of FIG. 4A) disposed to be spaced apart on different insulating layers of a substrate, and a conductive coupling member (e.g., the coupling member 423 of FIG. 4A) disposed to be capacitively fed between them, and thus may operate as a dual-band antenna. According to an embodiment, the pair of conductive plates may receive a signal via first communication circuits (e.g., RFIC, wireless communication circuits) 311, 321, 331, and 341 disposed on the substrate.

According to certain embodiments, the electronic device 300 may include a PCB 350 (e.g., a main PCB) mounted in an inner space. According to an embodiment, the PCB 350 may include a communication module 370 (e.g., a processor, CP) and a second communication circuit 360 (e.g., an intermediate frequency IC). According to an embodiment, the first communication circuit (e.g., RFIC) disposed to the communication device may be electrically connected with the second communication circuit 360 via an electrical connection member 381 (such as a printed conductive pattern). According to an embodiment, signals received via the communication devices 310, 320, 330, and 340 may be converted into intermediate frequency signals via the first communication circuit 311, 321, 331, and 341 (e.g., RFIC), and the intermediate frequency signals may be converted into a baseband frequency via the second communication circuit 360 and may be provided to the processor 370.

According to certain embodiments, although the plurality of communication devices 310, 320, 330, and 340 are disposed at respective edges of the electronic device 300, without being limited thereto, the communication devices may be disposed at various location in an inner space of the electronic device, and the number of the communication devices may be various. According to an embodiment, at least two of the communication devices 310, 320, 330, and 340 may operate by using a switching device (not shown). For another example, at least one communication devices 310, 320, 330, and 340 may be selectively switched according to a surrounding environment based on a sensor device. According to an embodiment, the sensor device may include a grip sensor, and the electronic device may detect a grip of the electronic device by the grip sensor and may provide control to operate at least one communication device disposed at a location for avoiding the grip.

Figure 4A:
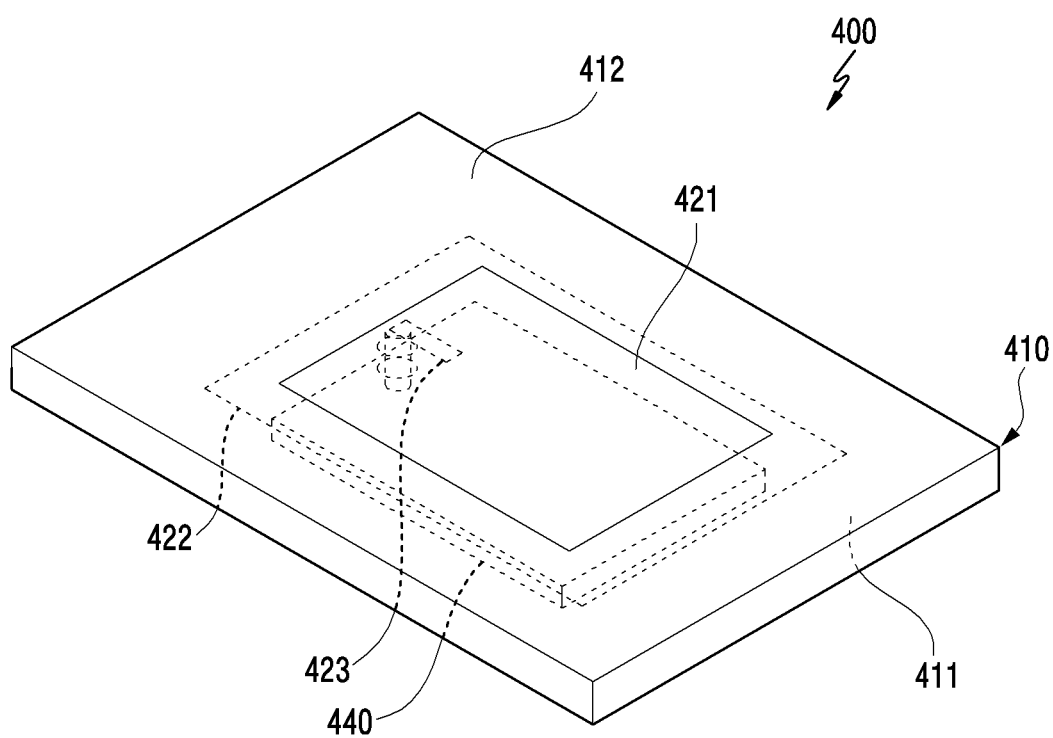
FIG. 4A is a perspective view of a communication device according to certain embodiments of the present disclosure.
Figure 4B:
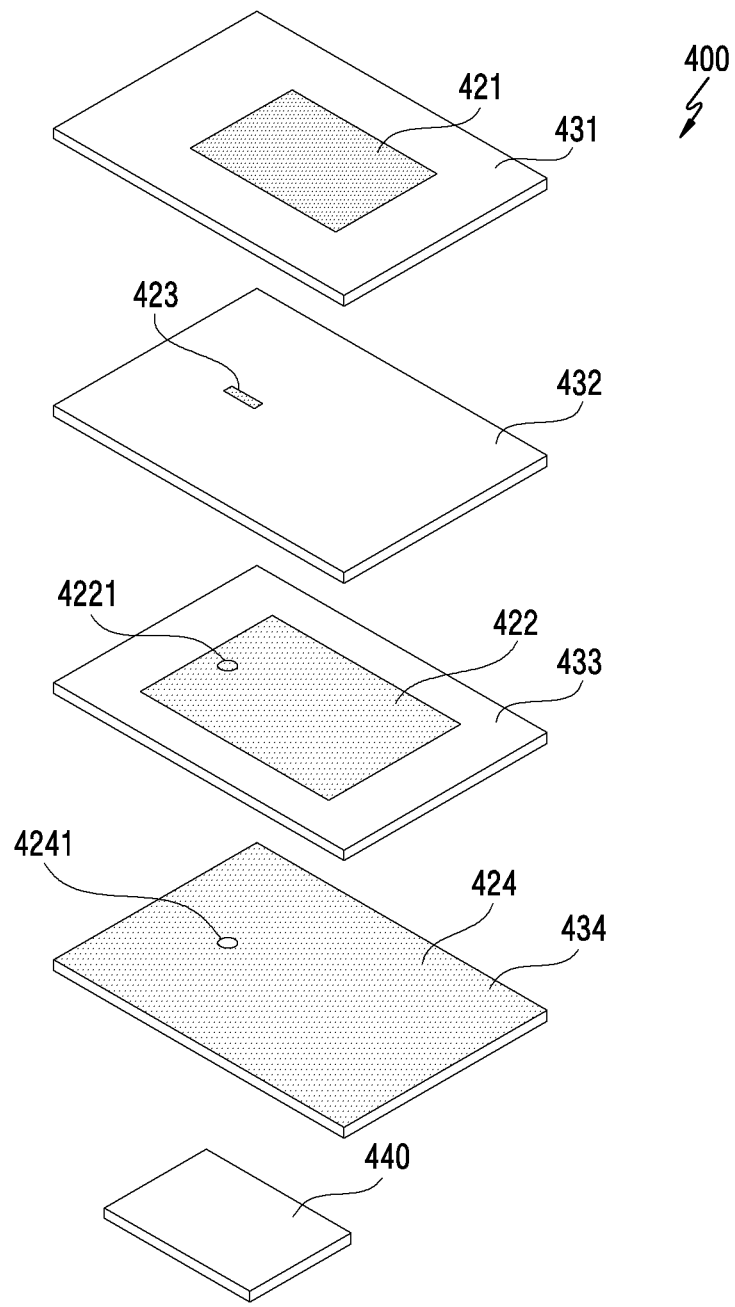
FIG. 4B is an exploded perspective view of a communication device according to certain embodiments of the present disclosure.
Figure 4C:
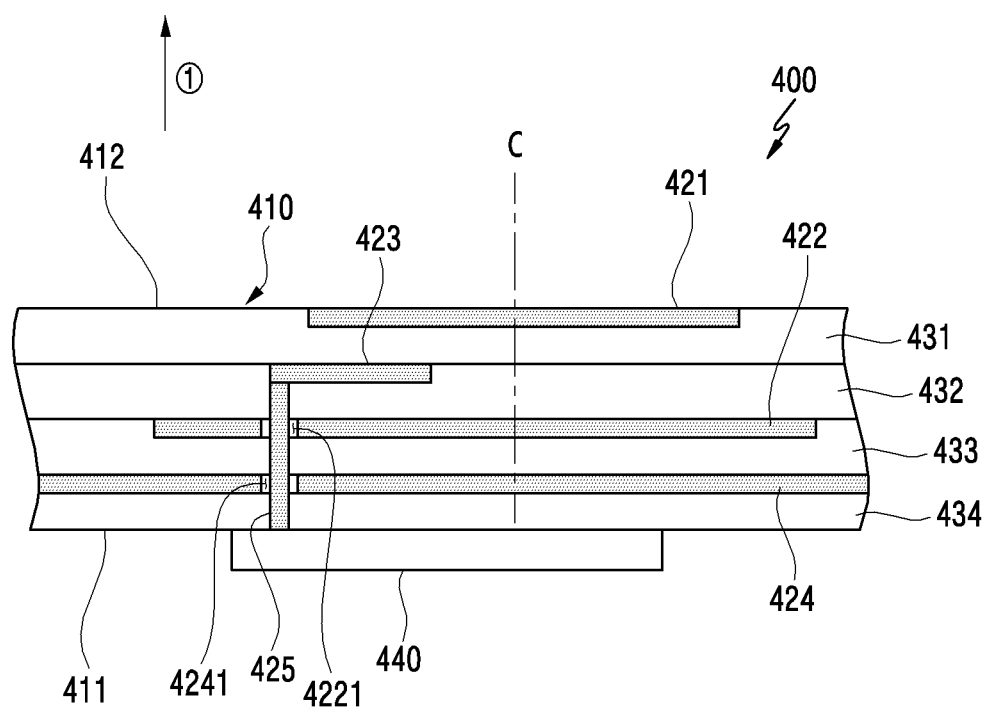
FIG. 4C is a cross-sectional view of a communication device according to certain embodiments of the present disclosure.

FIG. 4A is a partial perspective view of a communication device according to certain embodiments of the present disclosure. FIG. 4B is an exploded perspective view of a communication device according to certain embodiments of the present disclosure. FIG. 4C is a cross-sectional view of a communication device according to certain embodiments of the present disclosure.

A communication device 400 of FIG. 4A may be at least partially similar to the communication devices 310, 320, 330, and 340 of FIG. 3, or may include other embodiments of the communication device.

Referring to FIGS. 4A and 4B, the communication device 400 may include a substrate (or a Printed Circuit Board (PCB)) 410. According to an embodiment, the substrate 410 may include a first side 411 and a second side 412 facing away from the first side 411. According to an embodiment, the substrate 410 may be disposed, such that the second side 412 faces the rear plate (e.g., the rear plate 211 of FIG. 2B) and the first side 411 faces the front plate (e.g., the front plate 201 of FIG. 2A) of the electronic device (e.g., the electronic device 200 of FIG. 2B). However, without being limited thereto, the substrate 410 may also be disposed facing a lateral member (e.g., the lateral member 216 of FIG. 2A) of the electronic device.

According to an embodiment, the substrate 410 may include a first conductive plate 421 (e.g., a first conductive patch or a first conductive pattern) disposed on the second side 412. However, without being limited thereto, the first conductive plate 421 may also be disposed between a plurality of insulating layers stacked between the first side 411 and the second side 412.

According to an embodiment, the substrate 410 may include a second conductive plate 422 (e.g., a second conductive patch or a second conductive pattern) disposed to an insulating layer between the first side 411 and the second side 412. In certain embodiments, the first conductive plate 421 and the second conductive plate 422 can have an overlapping area when view from above the first side or the second side.

According to an embodiment, the substrate 410 may include a conductive coupling member 423 disposed between the first conductive plate 421 and the second conductive plate 422. According to an embodiment, the first conductive plate 421, the second conductive plate 422, and the conductive coupling member 423 may remain in a state of being physically spaced apart. According to an embodiment, the conductive coupling member 423 may be electrically connected with a communication circuit 440 disposed to the first side 411 of the substrate 410.

According to an embodiment, the conductive coupling member 423 may be fed via the communication circuit 440 (e.g., the first communication circuit 311 of FIG. 3, RFIC). According to an embodiment, the conductive coupling member 423, may cause the first conductive plate 421 and the second conductive plate 422 to form a capacitor that receives an electrical signal from the communication circuit 440.

According to certain embodiments, the first conductive plate 421 and the second conductive plate 422 may have different sizes and the same shape, and may be disposed to overlap with each other to have the same center. However, without being limited thereto, according to certain embodiments, the first conductive plate 421 may entirely overlap with the second conductive plate 422, and may be constructed to have a different shape from the second conductive plate 422. According to an embodiment, the communication circuit 440 may transmit a first signal including a first frequency via the first conductive plate 421. According to an embodiment, the communication circuit 440 may transmit a second signal including a second frequency via the second conductive plate 422.

According to an embodiment, the communication device 400 may be constructed in an array shape by displaying a plurality of antenna structures on a substrate. The antenna structure may include the first and second conductive plates 421 and 422 which form a capacitor receiving a signal from communication circuit 440 by means of the conductive coupling member 423 electrically connected with the communication circuit 440. In this case, each of the plurality of antenna structures may be electrically connected with the communication circuit 440. According to an embodiment, the first frequency may include a range of 23 GHz to 33 GHz, and the second frequency may include a range of 35 GHz to 45 GHz. According to an embodiment, the first conductive plate 421 and the second conductive plate 422 may be fed from the conductive coupling member 423 to form a beam pattern in a first direction (a direction ① of FIG. 4C, 4D, 4E, or 4F) (e.g., a −Z direction of FIG. 2A).

Referring to FIGS. 4B and 4C, the communication device 400 may include the first conductive plate 421, second conductive plate 422, and conductive coupling member 423, which are disposed on different respective insulating layers, of the substrate 410 including a plurality of insulating layers 431, 432, 433, and 434. According to an embodiment, the first conductive plate 421 may be disposed on the first insulating layer 431. According to an embodiment, the first conductive plate 421 may be disposed to the second side 412 of the substrate 410 in an exposed or not exposed manner.

According to an embodiment, the conductive coupling member 423 may be disposed between the first insulating layer 431 and the second insulating layer 432 of the substrate 410.

According to an embodiment, the second conductive plate 422 may be disposed between the second insulating layer 432 and the third insulating layer 433. According to an embodiment, a third conductive plate 424 may be disposed between the third insulating layer 433 and the fourth insulating layer 434 to operate as a ground plane (e.g., a ground layer).

According to an embodiment, the first conductive plate 421, the second conductive plate 422, the conductive coupling member 423, and the third conductive plate 424 may be disposed to insulating layers which are not neighboring to each other as long as they are located to be physically spaced apart from each other in the insulating layers included in the substrate 410.

According to certain embodiments, the first conductive plate 421 and the second conductive plate 422 may be constructed to have the same shape. According to an embodiment, the first conductive plate 421 and the second conductive plate 422 may be constructed to have different sizes. According to an embodiment, the first conductive plate 421 and the second conductive plate 422 may be disposed to overlap with each other and have the same center C. According to an embodiment, the first conductive plate 421 may be constructed to have a smaller size than the second conductive plate 422. According to an embodiment, the second conductive plate 422 may be constructed to have a smaller size than the first conductive plate 421. According to an embodiment, when overlapped, the third conductive plate 424 may be constructed to have a size and shape including all of the first conductive plate 421, the second conductive plate 422, and the conductive coupling member 423. According to an embodiment, the first conductive plate 421 may operate in a relatively higher frequency band than the second conductive plate 422. According to an embodiment, the first conductive plate 421 may operate in a band of 39 GHz. According to an embodiment, the second conductive plate 422 may operate in a band of 28 GHz.

According to certain embodiments, when viewed from above the second side 412 of the substrate 410, the conductive coupling member 423 may be disposed at a location where the first conductive plate 421 and the second conductive plate 422 overlap. According to an embodiment, the conductive coupling member 423 may be constructed in a line shape having a length and a width.

According to an embodiment, the second conductive plate 422 and the third conductive plate 424 may include through-holes 4221 and 4241 at overlapping locations. According to an embodiment, the conductive coupling member 423 may be electrically connected with the communication circuit 440, which is disposed to the first side 411 of the substrate 410 by using a conductive member 425 disposed through the through-holes 4221 and 4241, or which is disposed therearound.

According to an embodiment, the conductive member 425 may be disposed to remain in a state of being electrically insulated from the second conductive member 422 and the third conductive member 424. According to an embodiment, the conductive member 425 may include a conductive filler (e.g., a conductive via) which is filled into the substrate 410 and the through-holes 4221 and 4241.

According to certain embodiments, the communication device 400 may be powered from the communication circuit 440 via the conductive member 425 to the conductive coupling member 423. According to an embodiment, the first conductive plate 421 and the second conductive plate 422 form a capacitor (now referred to as "capacitively fed") via the first conductive plate 421 and the second conductive plate 422 to operate as an antenna radiator (e.g., a patch antenna). According to an embodiment, the first conductive plate 421 and the second conductive plate 422 may form a beam pattern in a direction ① of FIG. 4C (e.g., a −Z direction of FIG. 2A).

According to certain embodiments, an interval between the first conductive plate 421 and the conductive coupling member 423 or an interval between the conductive coupling member 423 and the second conductive plate 422 or an interval between the second conductive plate 422 and the third conductive plate 424 may be equal to or different from each other. According to an embodiment, the aforementioned intervals may be constructed by insulating layers each having a different thicknesses or may be constructed by disposing a plurality of different insulating layers in an overlapping manner.

According to certain embodiments, the first conductive plate 421, the second conductive plate 422, the conductive coupling member 423, and the third conductive plate 424 may be disposed in a metal pattern shape to corresponding insulating layers of the substrate 410. However, without being limited thereto, at least one of the first conductive plate 421, the second conductive plate 422, the conductive coupling member 423, and the third conductive plate 424 may include a metal plate attached to the substrate 410, a Flexible Printed Circuit Board (FPCB), or a conductive paint.

Figure 4D:
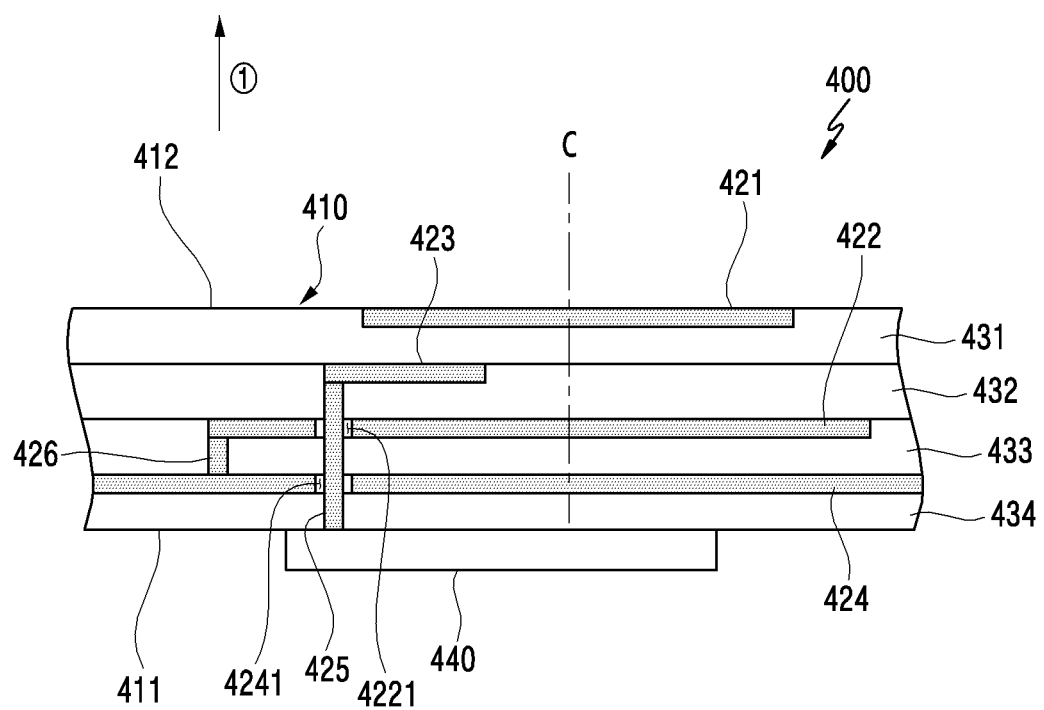
FIG. 4D, FIG. 4E, and FIG. 4F are cross-sectional views of a communication device according to certain embodiments of the present disclosure.
Figure 4E:
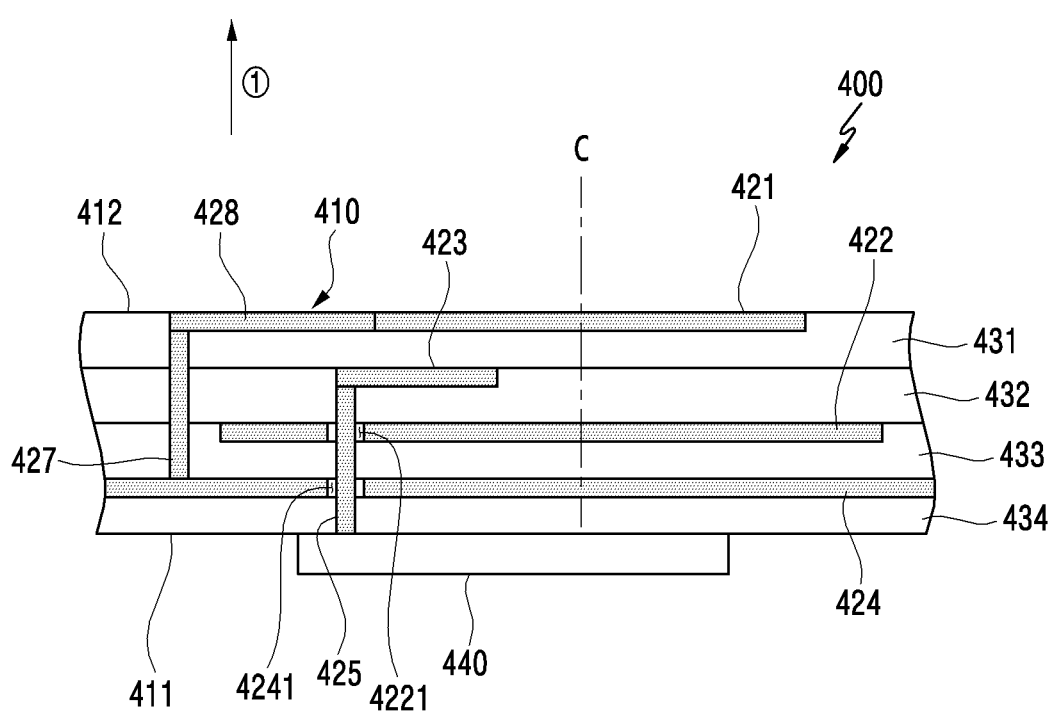
Figure 4F:
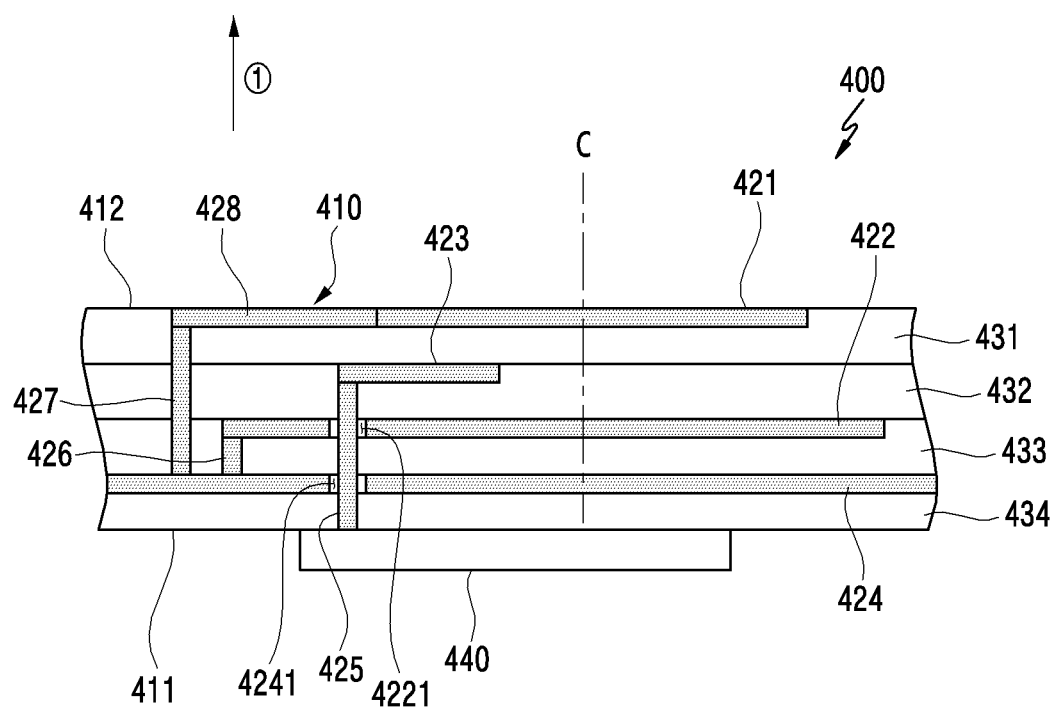

FIGS. 4D, 4E, and 4F are cross-sectional views of a communication device according to certain embodiments of the present disclosure.

Referring to FIG. 4D, in a structure of FIG. 4C, the second conductive plate 422 and the third conductive plate 424 which is used as a ground plane may be electrically connected by means of a conductive connection member 426. According to an embodiment, the second conductive plate 422 electrically connected with the third conductive plate 424 may operate in a Planar Inverted F Antenna (PIFA) structure via the conductive coupling member 423. For example, the second conductive plate 422 may operate in a relatively low frequency band in comparison with the second conductive plate 422 of FIG. 4C. According to an embodiment, the conductive connection member 426 may be electrically connected in such a manner that the second conductive plate 422 is in contact with the third conductive plate 424 in a point contact, line contact, or surface contact manner.

Referring to FIG. 4E, in the structure of FIG. 4C, the first conductive plate 421 and the third conductive plate 424 which is used as a ground plane may be electrically connected by means of at least one of conductive connection members 427 and 428. According to an embodiment, the first conductive plate 421 electrically connected with the third conductive plate 424 may operate in a Planar Inverted F Antenna (PIFA) structure. For example, the first conductive plate 421 may operate in a relatively low frequency band in comparison with the first conductive plate 421 of FIG. 4C. According to an embodiment, the conductive connection members 427 and 428 may be electrically connected in such a manner that the first conductive plate 421 is in contact with the third conductive plate 424 in a point contact, line contact, or surface contact manner. According to an embodiment, the single conductive connection member 428 may be constructed by being extended by the same width as that of the first conductive plate 421, or may be constructed in a line shape similarly to the single conductive connection member 427.

Referring to FIG. 4F, in the structure of FIG. 4C, the first conductive plate 421, the second conductive plate 422, and the third conductive plate 424 which is used as a ground plate may be electrically connected by means of at least one of conductive connection members 426, 427, and 428, respectively. According to an embodiment, the first conductive plate 421 electrically connected with the third conductive plate 424 may operate in a Planar Inverted F Antenna (PIFA) structure. According to an embodiment, the second conductive plate 422 electrically connected with the third conductive plate 424 may operate in the PIFA structure. For example, the first conductive plate 421 may operate in a relatively low frequency band via the conductive coupling member 423 in comparison with the first conductive plate 421 of FIG. 4C. For another example, the second conductive plate 422 may operate in a relatively low frequency band via the conductive coupling member 423 in comparison with the second conductive plate 422 of FIG. 4C. According to an embodiment, the conductive connection members 426, 427, and 428 may be electrically connected in such a manner that the first conductive plate 421 and the second conductive plate 422 are in contact with the third conductive plate 424 in a point contact, line contact, or surface contact manner. According to an embodiment, the single conductive connection member 428 may be constructed by being extended by the same width as that of the first conductive plate 421, or may be constructed in a line shape similarly to the single conductive connection member 427.

FIGS. 5A, 5B, 5C, and 5D illustrate an electric field distribution and radiation pattern of a communication device according to certain embodiments of the present disclosure.

Figure 5A:
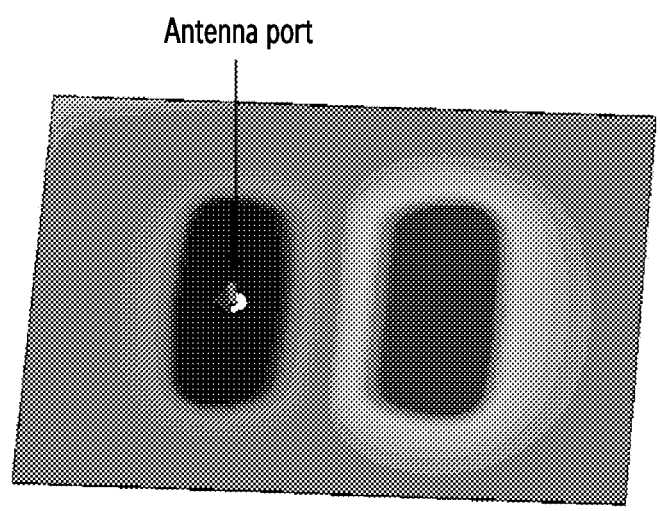
FIG. 5A, FIG. 5B, FIG. 5C, and FIG. 5D illustrate an electric field distribution and radiation pattern of a communication device according to certain embodiments of the present disclosure.
Figure 5B:
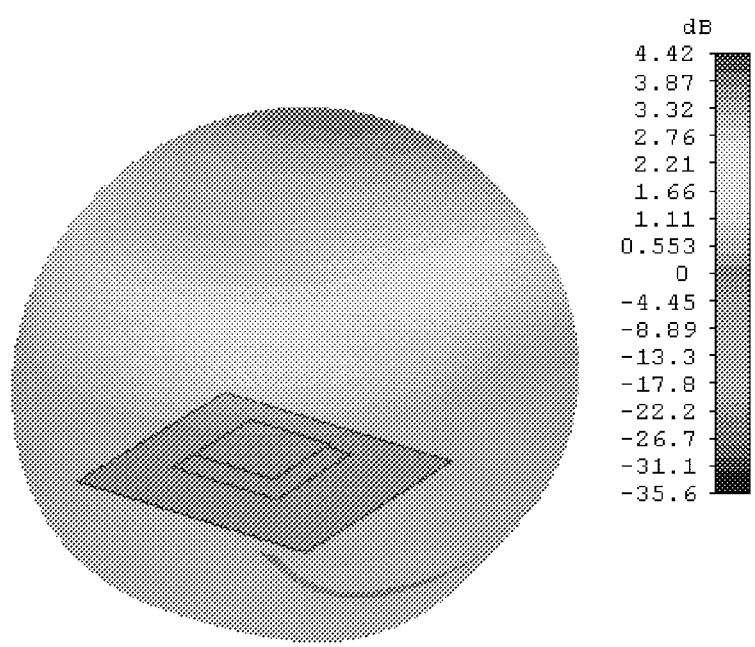
Figure 5C:
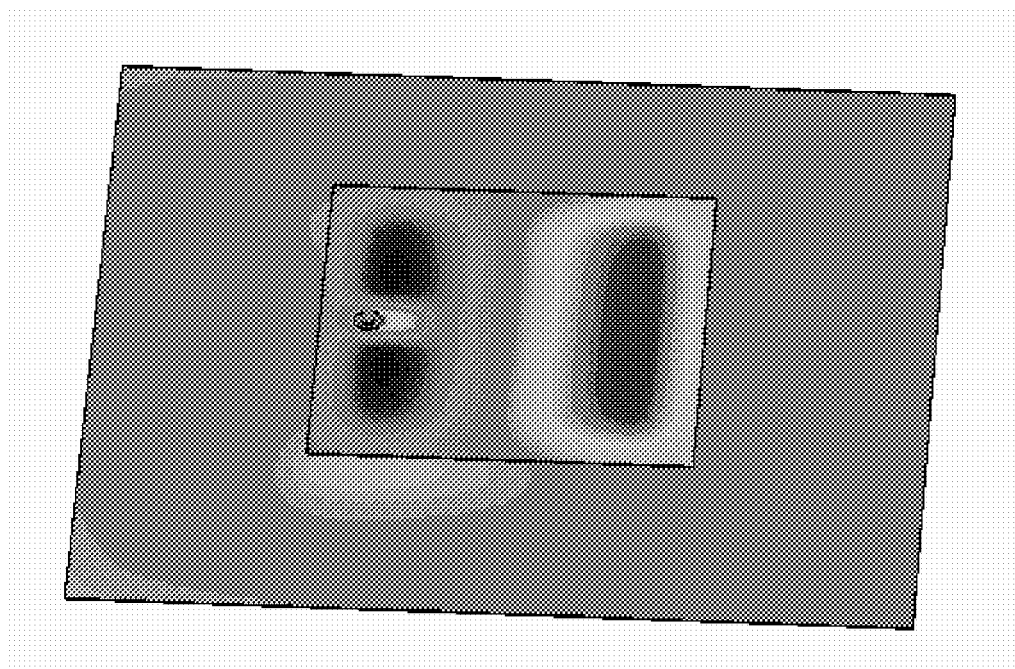
Figure 5D:
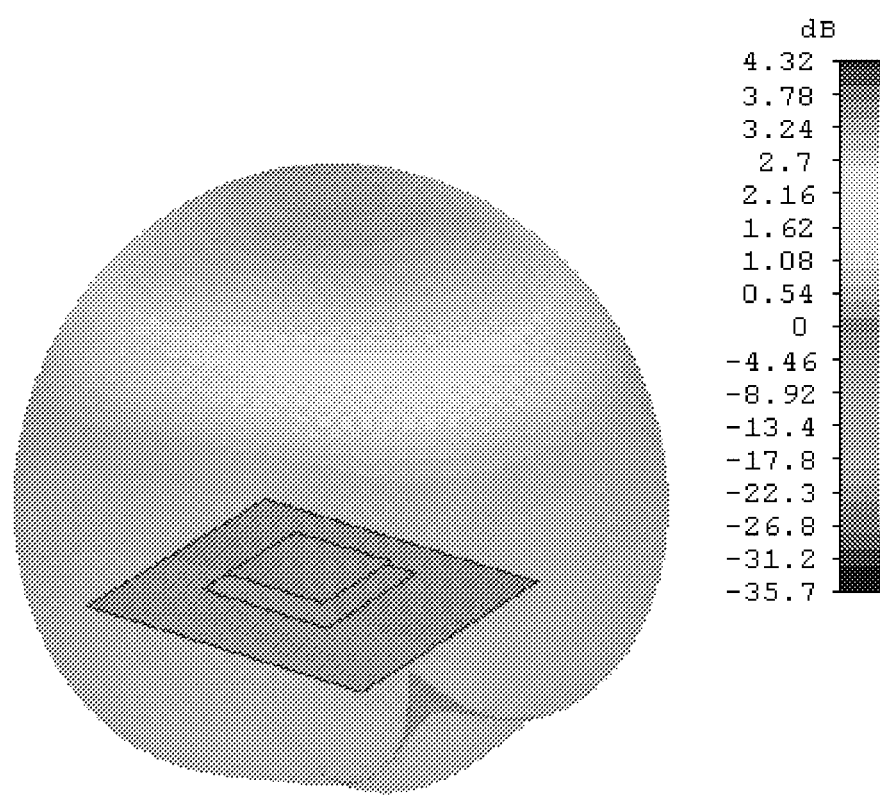

FIGS. 5A and 5B illustrate an electric field distribution and a radiation pattern via a first conductive plate (e.g., the first conductive plate 421 of FIG. 4C), and FIGS. 5C and 5D illustrate an electric field distribution and a radiation pattern via a second conductive plate (e.g., the second conductive plate 422 of FIG. 4C).

As shown in FIGS. 5A, 5B, 5C, and 5D, a conductive coupling member (e.g., the conductive coupling member 423 of FIG. 4C) may constitute an electric field in a periphery thereof, and may be simultaneously fed by generating coupling and a unique field caused by the first conductive plate 421 and second conductive plate 422 located in the periphery thereof. For example, as illustrated, it can be seen that the first conductive plate 421 and the second conductive plate 422 have an electric field distribution which is specific to a patch antenna with in a left and right symmetrical shape with respect to the center.

Figure 6:
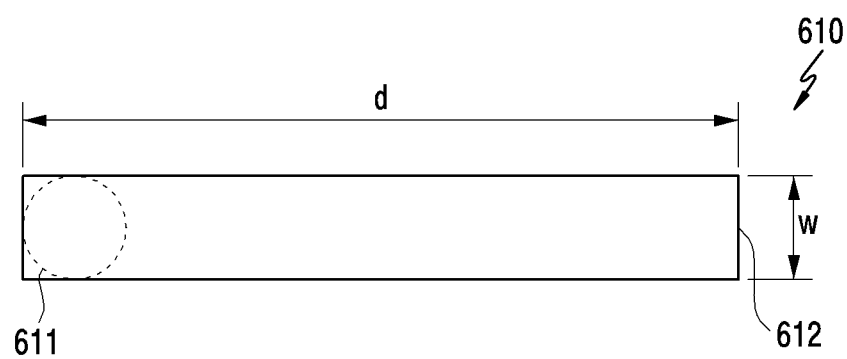
FIG. 6 illustrates a structure of a conductive coupling member according to certain embodiments of the present disclosure.

FIG. 6 illustrates a structure of a conductive coupling member according to certain embodiments of the present disclosure.

A conductive coupling member 610 of FIG. 6 may be at least partially similar to the conductive coupling member 423 of FIGS. 4A, 4B, and 4C, or may include other embodiments of the conductive coupling member.

According to certain embodiments, the conductive coupling member 610 may be constructed in a shape having a specific length and a specific width. For example, the conductive coupling member 610 may have a specific length d and a specific width w from a feeding port 611 electrically connected with a conductive member (e.g., the conductive member 425 of FIG. 4C) to a terminal end 612 thereof. According to an embodiment, the conductive coupling member 610 may be properly modified in length and width for impedance matching.

According to certain embodiments, as shown in FIGS. 5A and 5C, a communication device (e.g., the communication device 400 of FIG. 4C) has an E-field of which intensity is decreased toward a center portion and an E-field of which intensity is increased toward a periphery portion of a conductive plate (e.g., the conductive plates 421 and 422 of FIG. 4C), which may cause an impedance change depending on a feeding position. According to an embodiment, voltage at the feeding port is increased in proportion to an increase in a field of the feeding position. Therefore, in case of direct feeding (e.g., in case of being electrically connected through physical contact), the impedance increases as the feeding port moves to the periphery, and decreases as the feeding port moves to the center portion. However, the coupling feeding structure proposed in the exemplary embodiment of the present disclosure operates by coupling a main radiator and an antenna port, and in general, an impedance of the main radiator is viewed as a reciprocal when coupling occurs. Equation (1) below is an approximated impedance equation when electric coupling occurs.

$$Z_{in} = \frac{K^2}{Z_a} \quad (1)$$

Herein, Za denotes an impedance of a patch antenna, K denotes a coupling coefficient, and Zin denotes an impedance viewed from a port. Therefore, it shows a tendency opposite to the case of direct feeding. When the conductive coupling member is elongated and thus a terminal end thereof is located at the center portion of the conductive plate, the impedance is increased as opposed to direct feeding, and when the terminal end thereof is shortened, the impedance is decreased. In addition, when a width of the conductive coupling member is widened and thus coupling is increased, the coupling coefficient K is increased in the above equation, and the impedance at the feeding port is increased.

Figure 7A:
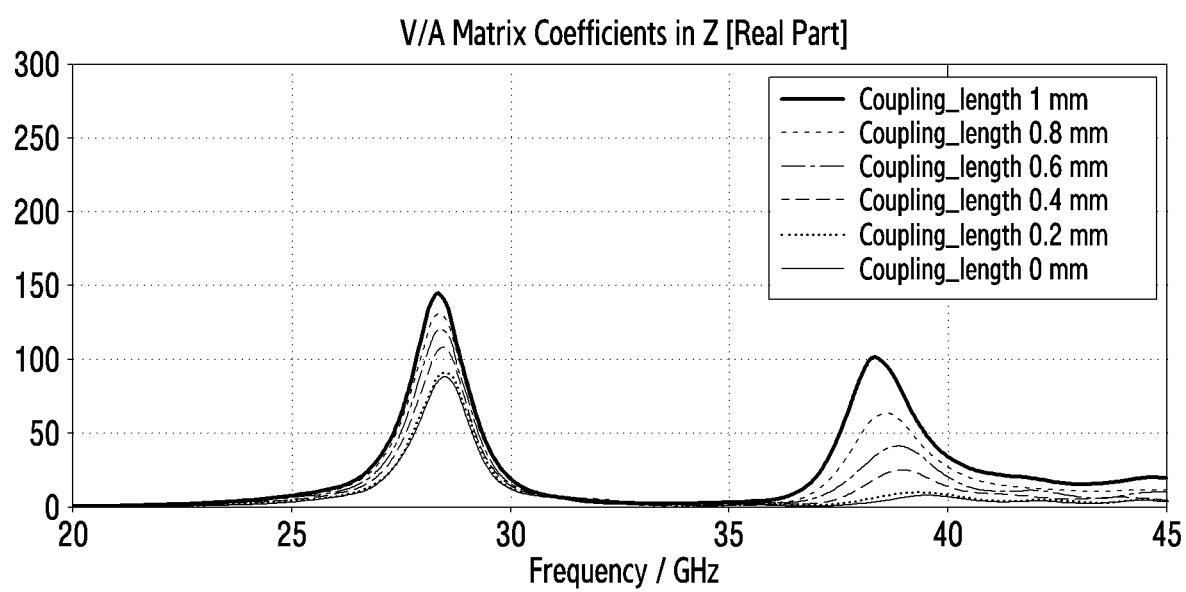
FIG. 7A and FIG. 7B are graphs illustrating an impedance change depending on a change in a length and width of a conductive coupling member according to certain embodiments of the present disclosure.
Figure 7B:
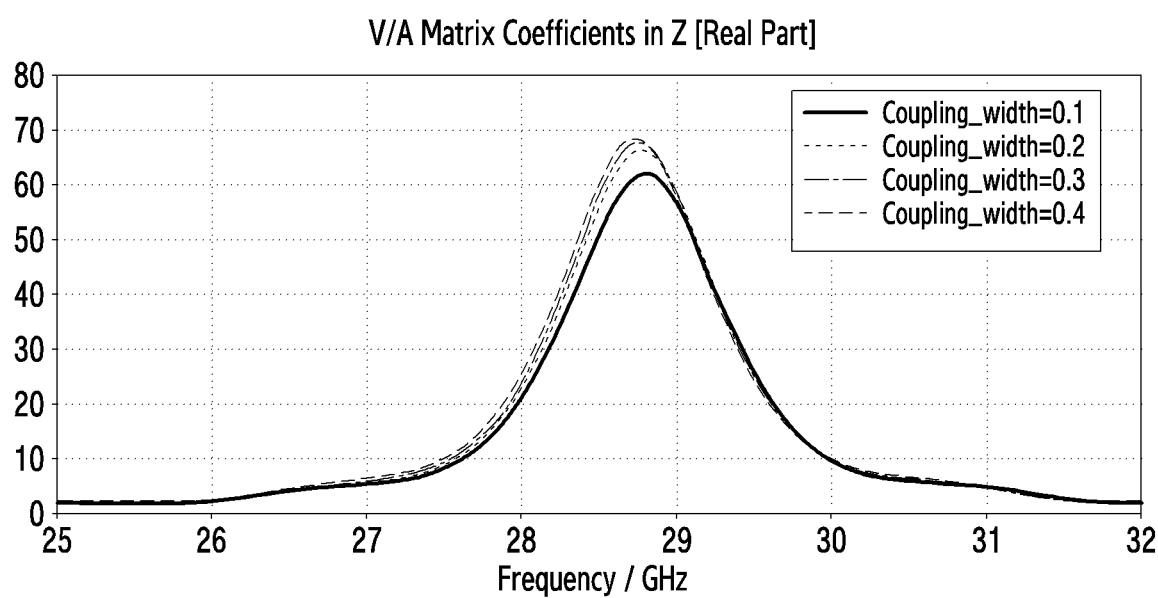

FIGS. 7A and 7B are graphs illustrating an impedance change (vertical axis) as a function of frequency (horizontal axis) depending on a change in a length and width of a conductive coupling member according to certain embodiments of the present disclosure.

FIG. 7A is a graph illustrating a change in a real-number value of an impedance (resistance value) depending on a change (e.g., 0 mm to 1 mm) in a length d of a conductive coupling member (e.g., the conductive coupling member 610 of FIG. 6). It can be seen that the longer the length d of the conductive coupling member 610, the higher the impedance. Therefore, it is possible to implement an antenna capable of exhibiting maximum radiation performance in a corresponding band by properly adjusting the length d of the conductive coupling member 610.

FIG. 7B is a graph illustrating a change in a real-number value of an impedance (resistance value) depending on a change (e.g., 0.1 mm-0.4 mm) in a width w of a conductive coupling member (e.g., the conductive coupling member 610 of FIG. 6). It can be seen that the wider the width w of the conductive coupling member 610, the higher the impedance. Therefore, it is possible to implement an antenna capable of exhibiting maximum radiation performance in a corresponding band by properly adjusting the length d and width w of the conductive coupling member 610.

According to certain embodiments, the conductive coupling member (e.g., conductive coupling member 610 of FIG. 6) has an electric field distribution which is bisected with respect to a center C as shown in FIGS. 5A and 5C, and thus may not be constructed to have a length greater than or equal to a length from the feeding portion to the bisected portion.

Figure 8A:
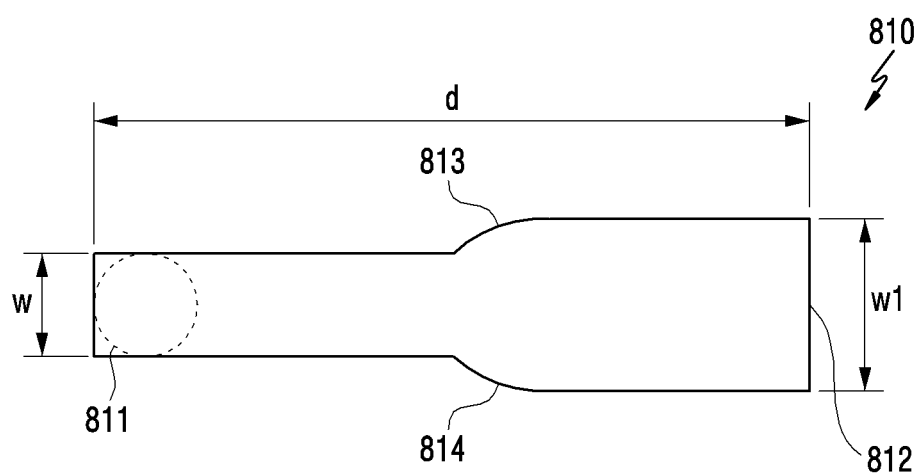
FIG. 8A, FIG. 8B, and FIG. 8C illustrate a structure of a conductive coupling member according to certain embodiments of the present disclosure.
Figure 8B:
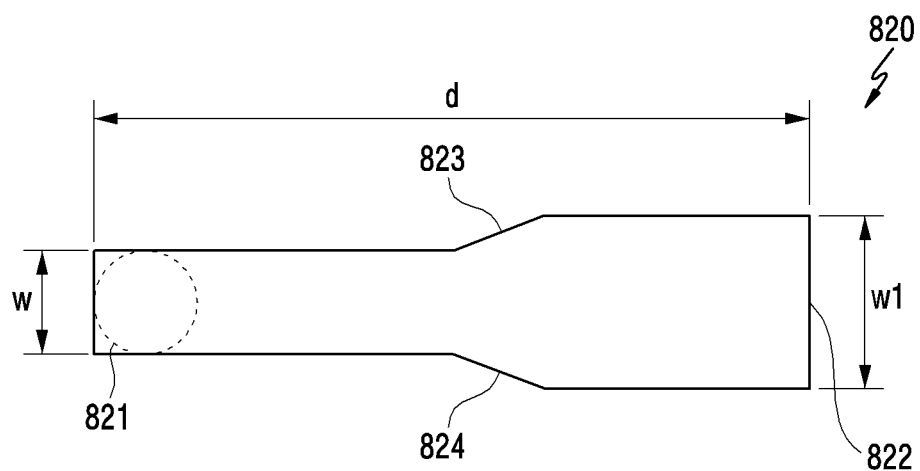
Figure 8C:
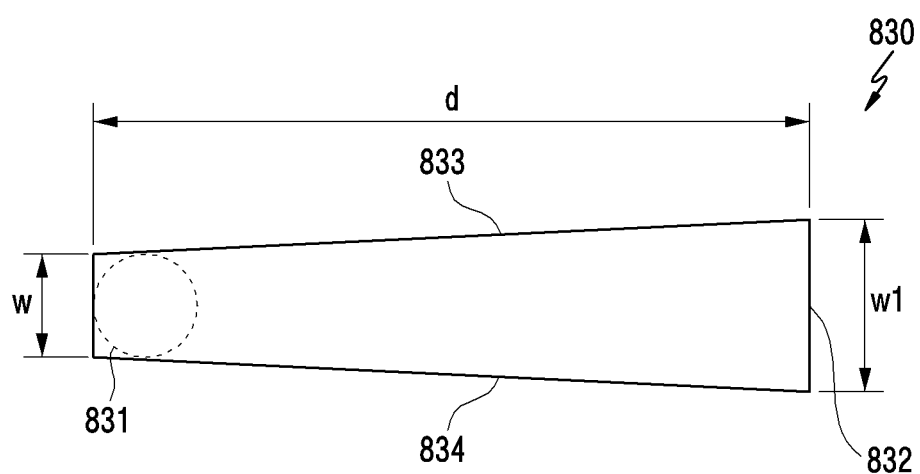

FIGS. 8A, 8B, and 8C illustrate a structure of a conductive coupling member according to certain embodiments of the present disclosure.

Conductive coupling members 810, 820, and 830 of FIGS. 8A, 8B, and 8C may be at least partially similar to the conductive coupling member 423 of FIGS. 4A to 4D, or may include other embodiments of the conductive coupling member.

FIGS. 8A, 8B, and 8C illustrate a structure having a specific length d from feeding ports 811, 821, and 831 of the conductive coupling members 810, 820, and 830 to terminal ends 812, 822, and 832 and having a width which changes in various manners when proceeding from the feeding ports 811, 821, and 831 to the terminal ends 812, 822, and 832.

Referring to FIG. 8A, the conductive coupling member 810 may be constructed to have a length d from the feeding port 811 having a first width w to the terminal end 812 having a second width w1. According to an embodiment, the conductive coupling member 810 may be constructed to include tapered portions 813 and 814 having a curved shape in which a width is gradually changed from w to w1 at a specific point.

Referring to FIG. 8B, the conductive coupling member 820 may be constructed to have a length d from the feeding port 821 having a first width w to the terminal end 822 having a second width w1. According to an embodiment, the conductive coupling member 820 may be constructed to include tapered portions 823 and 824 having a curved shape in which a width is gradually changed from w to w1 at a specific point.

Referring to FIG. 8C, the conductive coupling member 830 may be constructed to have a length d from the feeding port 831 having a first width w to the terminal end 832 having a second width w1. According to an embodiment, the conductive coupling member 830 may be constructed to include tapered portions 833 and 834 having a curved shape in which a width is gradually changed from w to w1 at a specific point. However, without being limited thereto, a tapered portion having a linear shape may be replaced by a tapered portion having a curved shape.

According to certain embodiments, a gradually changing tapered portion of the conductive coupling member may be constructed in such a manner that a width thereof is gradually increased or decreased as it progresses from a feeding port to a terminal end.

Figure 9:
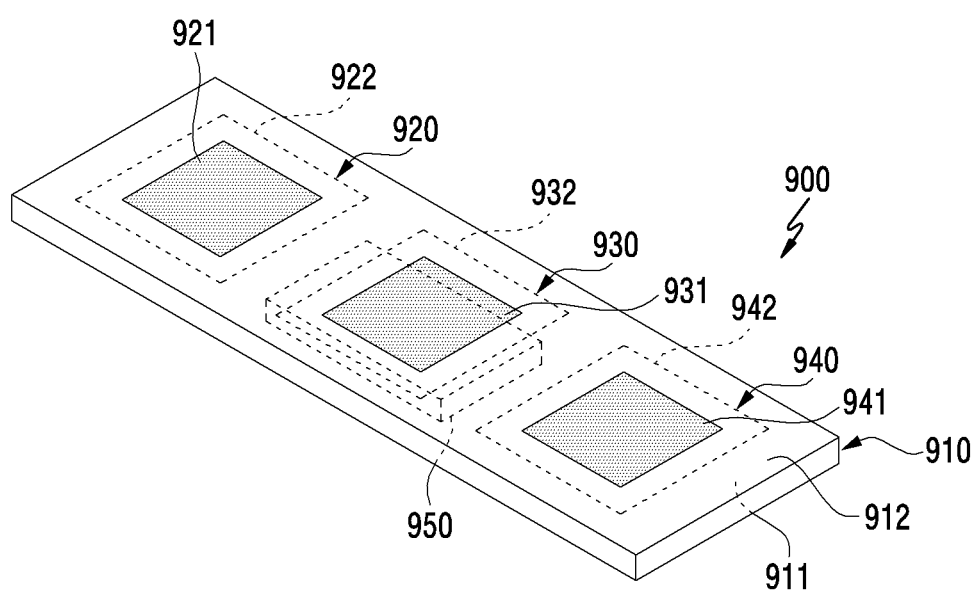
FIG. 9 illustrates a structure of a communication device according to certain embodiments of the present disclosure.

FIG. 9 illustrates a structure of a communication device according to certain embodiments of the present disclosure.

A communication device 900 of FIG. 9 may be at least partially similar to the communication devices 310, 320, 330, and 340 of FIG. 3, or may include certain embodiments of the communication device.

Referring to FIG. 9, the communication device 900 may include a first side 911 and a second side 912 facing an opposite direction in the first side 911. According to an embodiment, a plurality of antennas 920, 930, and 940 having the aforementioned structures of FIG. 4A to FIG. 4C are disposed in an array shape having a specific interval, thereby overcoming a high loss of a free space and improving an antenna gain.

For example, the first antenna 920 may include a first conductive plate 921 disposed within a substrate 901 and a second conductive plate 922 overlapping with the first conductive plate 921 and separated by a specific insulated interval.

According to an embodiment, in a region of the substrate 910 separated by a specific interval from the first antenna 920, the second antenna 930 may include a first conductive plate 931 disposed within the substrate 910 and a second conductive plate 932 overlapping with the first conductive plate 931 and separated by a specific insulated interval.

According to an embodiment, in a region of the substrate 910 separated by a specific interval from the second antenna 930, the third antenna 940 may include a first conductive plate 941 disposed within the substrate 910 and a second conductive plate 942 overlapping with the first conductive plate 941 and separated by a specific insulated interval.

According to certain embodiments, the first antenna 920, the second antenna 930, and the third antenna 940 may be disposed to be capacitively fed by a conductive coupling member (e.g., the conductive coupling member 423 of FIG. 4C) disposed between the first conductive plates 921, 931, and 941 and the second conductive plates 922, 932, and 942 respectively in a substrate 910. According to an embodiment, the conductive coupling member of the first antenna 920, the second antenna 930, and the third antenna 940 may be, for example, mounted to the first side 911 of the substrate 910 or electrically connected with a communication circuit 950 disposed around the substrate 910.

Figure 10:
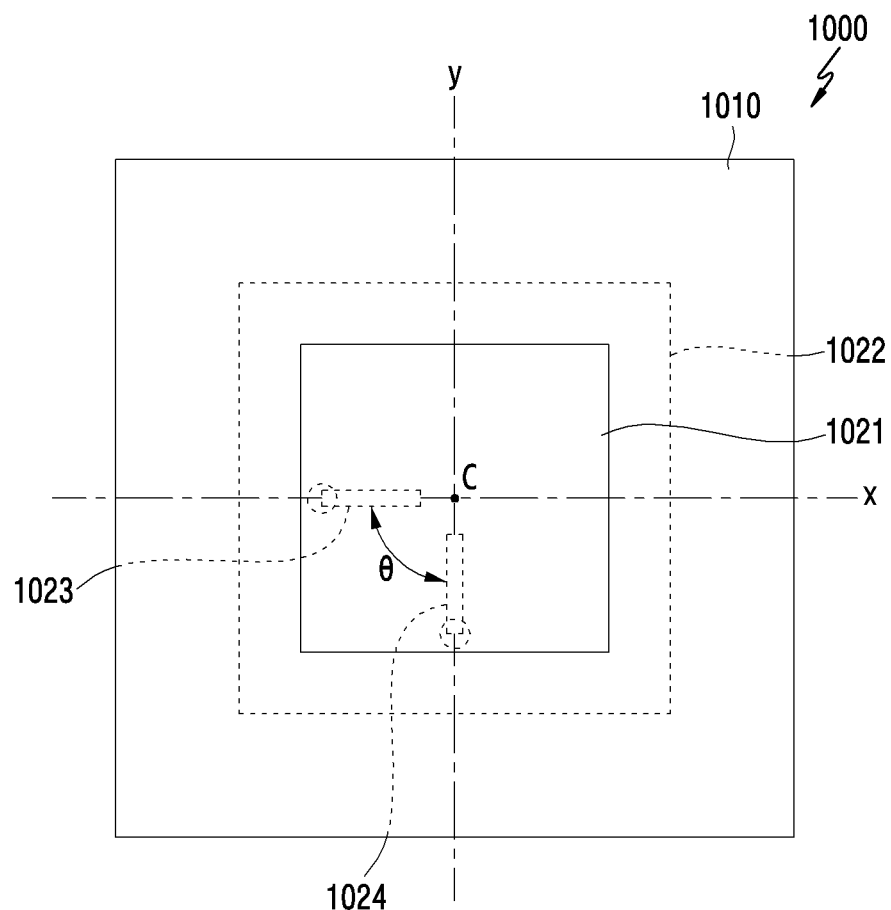
FIG. 10 is a diagram illustrating a communication device supporting dual polarization according to certain embodiments of the present disclosure.

FIG. 10 is a diagram illustrating a communication device supporting dual polarization according to certain embodiments of the present disclosure.

A communication device 1000 of FIG. 10 may be at least partially similar to the communication devices 301, 320, 330, and 340 of FIG. 3, or may include certain embodiments of the communication device.

An electrical connection structure of a first conductive plate 1021, a second conductive plate, a pair of conductive coupling members 1023 and 1024 disposed therebetween may be identical or similar to the structure of FIGS. 4A to 4C.

Referring to FIG. 10, the communication device 1000 may include a substrate 1010, a first conductive plate 1021 disposed within the substrate 1010. A second conductive plate 1022 is disposed within the substrate 1010 at a position overlapping with and spaced apart from the first conductive plate 1021. A first conductive coupling member 1023 is disposed at a point of the region of overlap between the first conductive plate 1021 and the second conductive plate 1022. A second conductive coupling member 1024 disposed at a position of the region of overlap which forms a specific angle θ with the first conductive coupling member 1023 with respect to a center C. According to an embodiment, the angle θ may be 90 degrees, substantially 90 degrees, or within 2 degrees between 90 degrees. According to an embodiment, the first conductive plate and the second conductive plate may be symmetrical with respect to at least two virtual lines (e.g., x- and y-axes) which pass through a center and are perpendicular to each other. According to an embodiment, the first conductive plate and the second conductive plate may be constructed in a square shape.

According to certain embodiments, the first conductive plate 1021 and the second conductive plate 1022 are capacitively fed respectively by a pair of the conductive coupling members 1023 and 1024 of which a center C is disposed to have an angle of 90 degrees, substantially 90 degrees, or within 2 degrees of 90 degrees with respect to a Z-axis, thereby constituting two polarizations.

Figure 11:
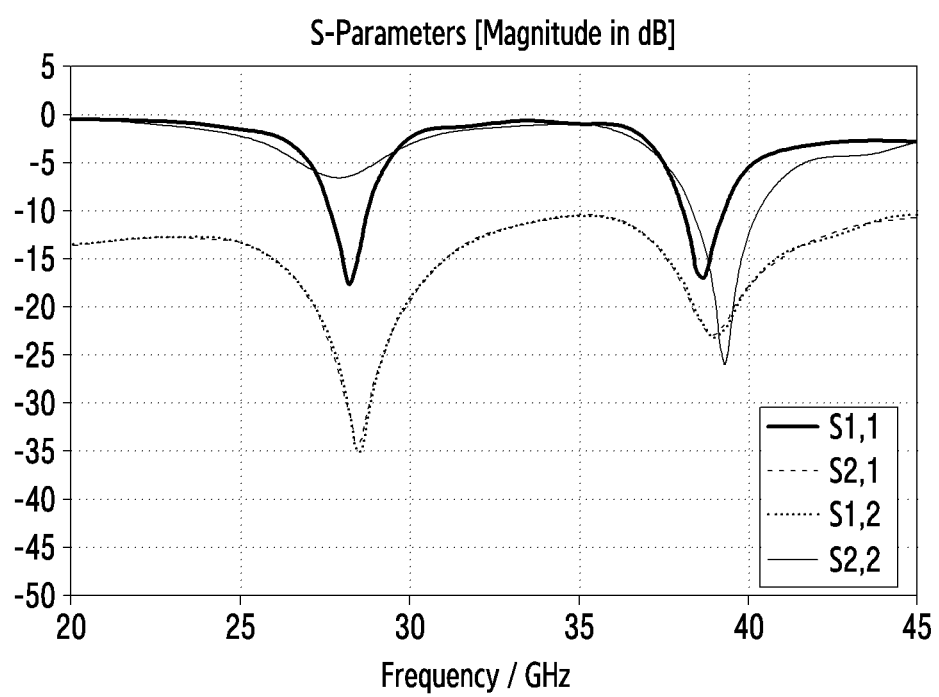
FIG. 11 is a graph illustrating an S-parameter of the communication device of FIG. 10 according to certain embodiments of the present disclosure.

FIG. 11 is a graph illustrating an S-parameter of the communication device of FIG. 10 according to certain embodiments of the present disclosure. As illustrated, it can be seen that the communication module 1000 creates different polarizations while constituting dual resonance in a 28 GHz band and a 39 GHz band, thereby improving an isolation characteristic.

Figure 12:
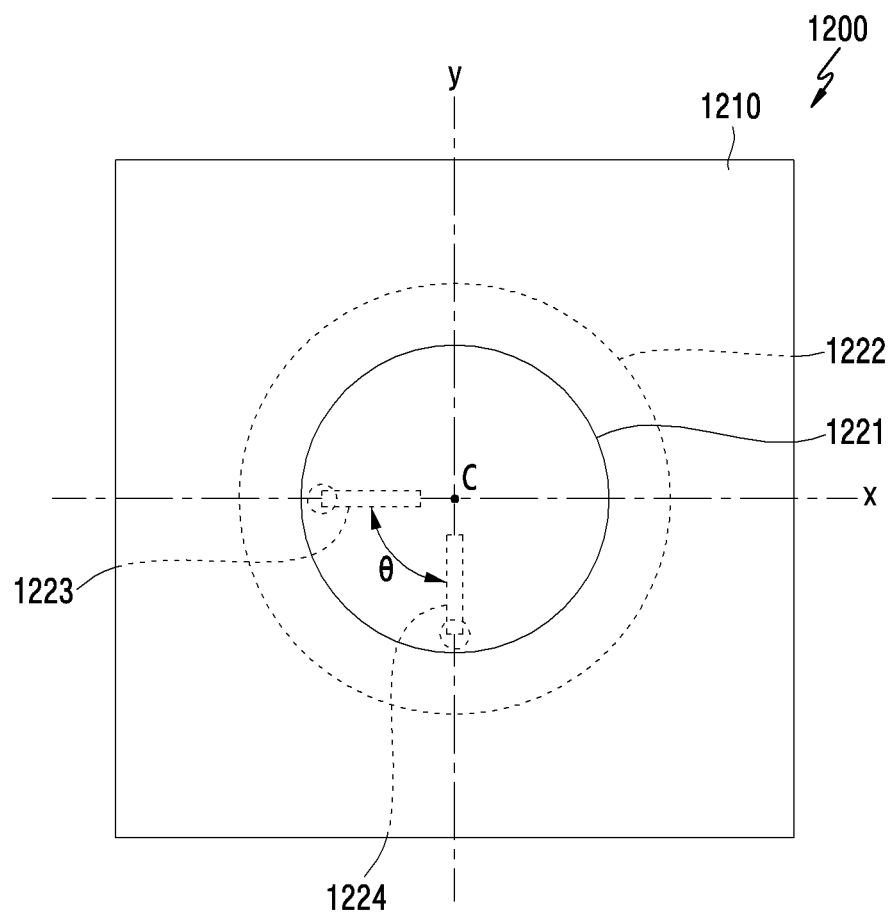
FIG. 12 and FIG. 13 illustrate a structure of a communication device for supporting dual polarization according to certain embodiments of the present disclosure.
Figure 13:
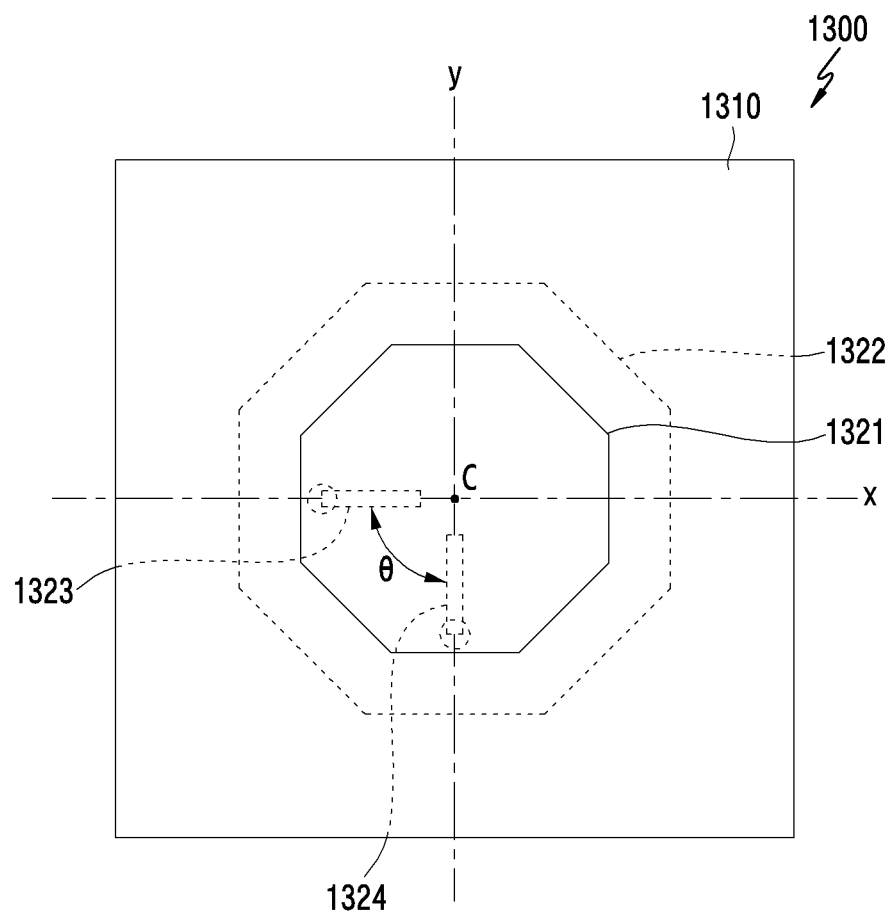

FIG. 12 and FIG. 13 illustrate a structure of a communication device for supporting dual polarization according to certain embodiments of the present disclosure.

A communication device 1200 of FIG. 12 may be at least partially similar to the communication devices 310, 320, 330, and 340 of FIG. 3, or may include certain embodiments of the communication device.

Referring to FIG. 12, the communication device 1200 may include a substrate 1210, a first conductive plate 1221 disposed within substrate 1210, a second conductive plate 1222 disposed at a position overlapping with and spaced apart from the first conductive plate 1221. A first conductive coupling member 1223 is disposed at a point of the region of overlap between the first conductive plate 1221 and the second conductive plate 1222. A second conductive coupling member 1224 is disposed at a point of the region of overlap between the first conductive plate 1221 and the second conductive plate 1222. The first conductive coupling member 1223 and the second conductive coupling member 1224 form and center C form a specific angle θ. According to an embodiment, the angle θ may be 90 degrees, substantially 90 degrees, or within 2 degrees of 90 degrees.

According to certain embodiments, the first conductive plate 1221 and the second conductive plate 1222 are capacitively fed respectively by a pair of the conductive coupling members 1223 and 1224 of which a center C is disposed to have an angle of 90 degrees with respect to a Z-axis, thereby constituting two polarizations.

Referring to FIG. 13, the first conductive plate 1321 and the second conductive plate form octagons having a common center C. A communication device 1300 may include a substrate 1310, a first conductive plate 1321 disposed within the substrate 1310, a second conductive plate 1322 disposed at a position overlapping with and spaced apart from the first conductive plate 1321. A first conductive coupling member 1323 is disposed at a point in the region of overlap between the first conductive plate 1321 and the second conductive plate 1322. A second conductive coupling member 1324 is disposed as a position in the region of overlap. The first conductive coupling member 1323, the second conductive coupling member 1324 and center C form a specific angle θ. According to an embodiment, the angle θ may include 90 degrees, substantially 90 degrees, or within 2 degrees of 90 degrees.

According to certain embodiments, the first conductive plate 1321 and the second conductive plate 1322 are capacitively fed respectively by a pair of the conductive coupling members 1323 and 1324 of which a center C is disposed to have an angle of 90 degrees, substantially 90 degrees, or within 2 degrees of 90 degrees, with respect to a Z-axis, thereby constituting two polarizations.

According to certain embodiments, the first conductive plates 1221 and 1321 and the second conductive plates 1222 and 1322 may be constructed in a circular shape of FIG. 12 or regular octagonal shape of FIG. 13, which can be symmetrically constructed with respect to at least two virtual lines (e.g., x- and y-axes) passing through a center C and perpendicular to each other. However, without being limited thereto, the first conductive plate and/or the second conductive plate may support dual polarization due to the aforementioned conductive coupling member when parasitic elements are symmetrically disposed even if the same parasitic element as a slot constructed or disposed for the purpose of bandwidth extension is used.

Figure 14A:
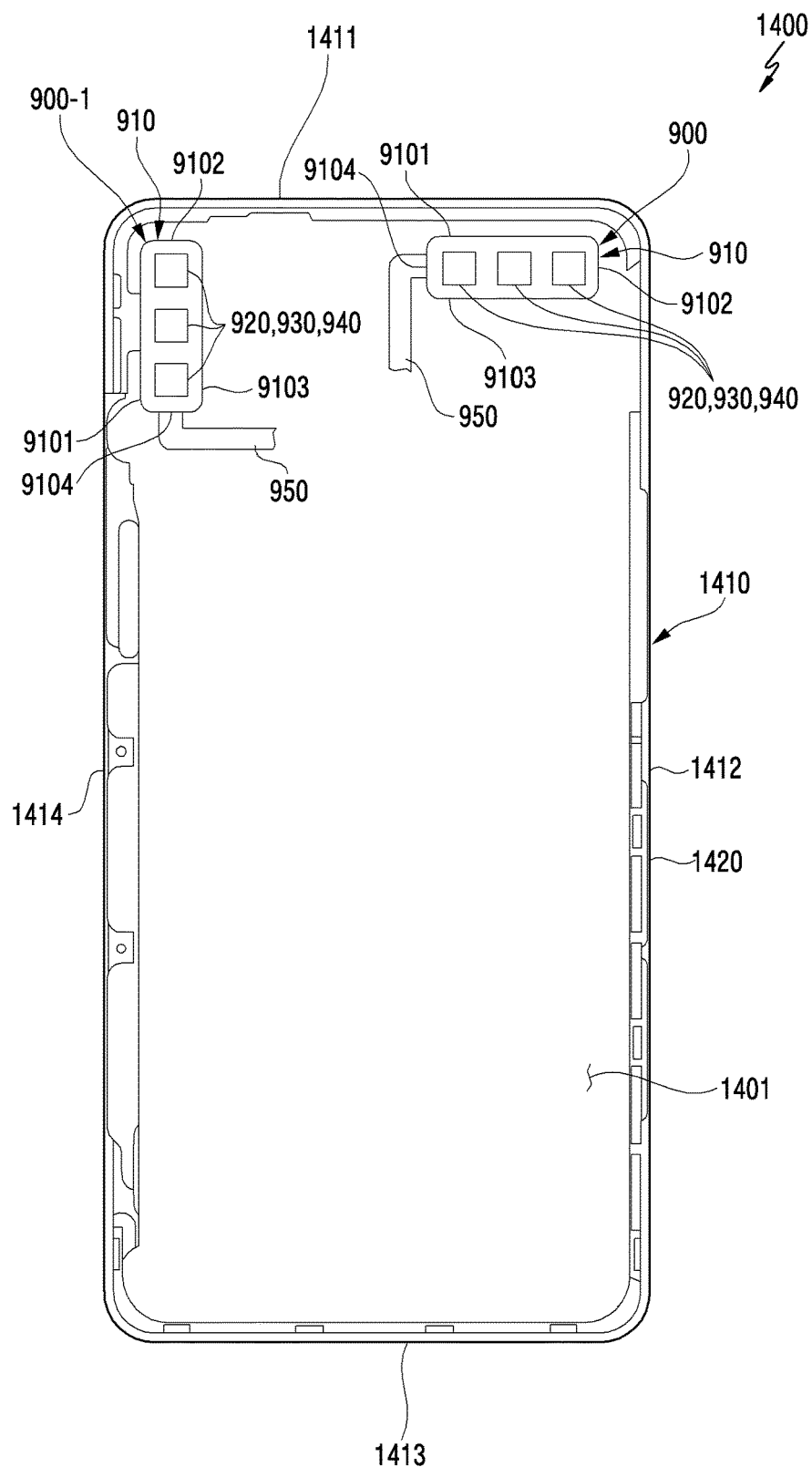
FIG. 14A and FIG. 14B illustrate a deployment of a communication device according to certain embodiments of the present disclosure.
Figure 14B:
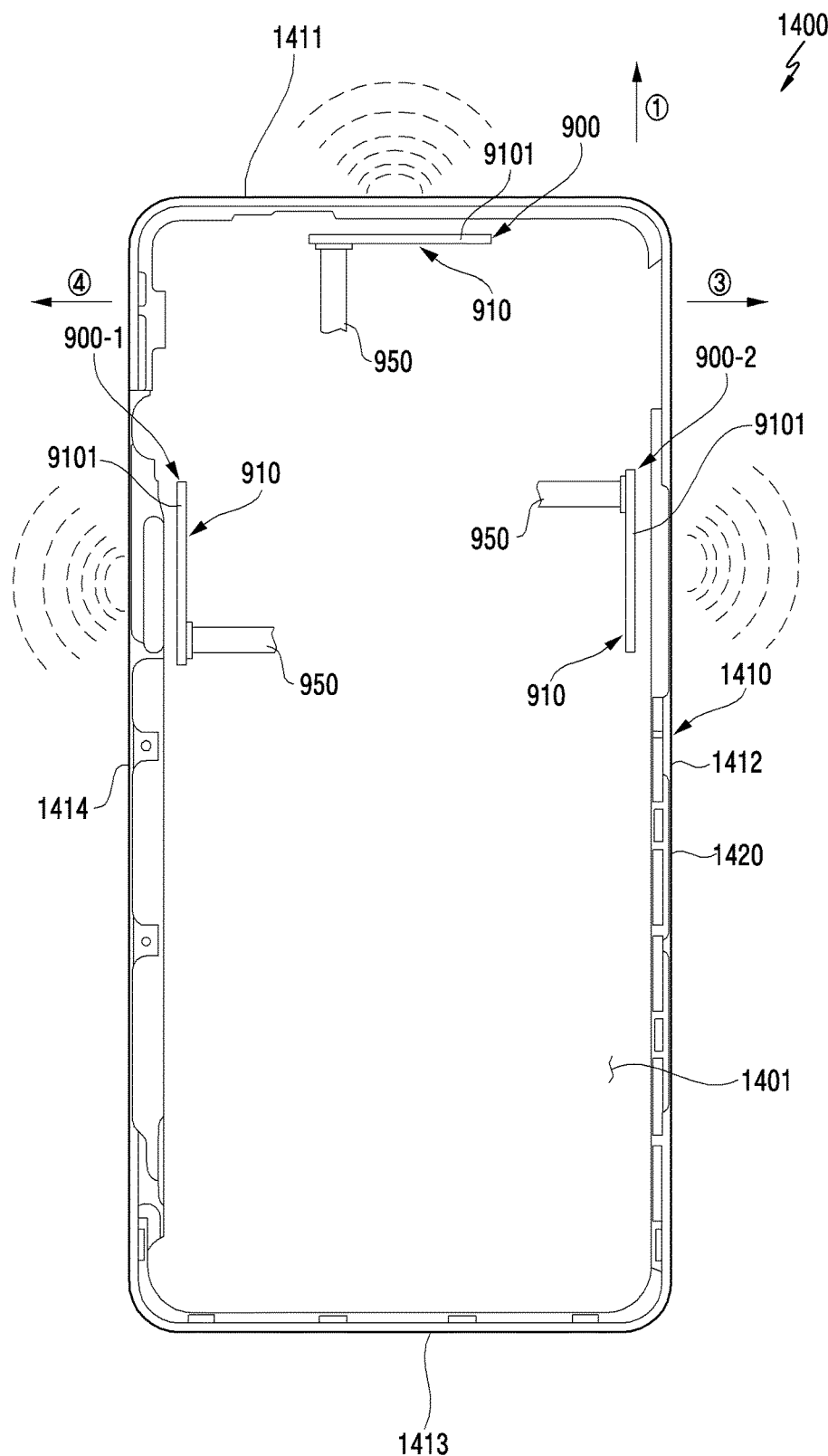

FIGS. 14A and 14B illustrate a deployment of a communication device according to certain embodiments of the present disclosure.

The communication device of FIGS. 14A and 14B comprises the communication device 900 of FIG. 9 for example, but is not limited thereto. For example, the communication device 900 of FIGS. 14A and 14B may be replaced by the communication device 400 of FIGS. 4A to 4F, the communication device 1000 of FIG. 10, the communication device 1200 of FIG. 12, or the communication device 1300 of FIG. 13.

Referring to FIG. 14A, an electronic device 1400 may include a housing 1410. According to an embodiment, the housing 1410 may include a lateral member 1420. According to an embodiment, at least part of the lateral member 1420 may be constructed of a conductive member, and may be implemented with a unit conductive portion by means of a non-conductive portion to operate as an antenna radiator.

According to certain embodiments, the housing 1410 may include a first portion 1411 having a first length, a second portion 1412 extended in a direction orthogonal to the first portion 1411 and having a second length, a third portion 1413 extended to have the first length in parallel with the first portion 1411, and a fourth portion 1414 extended from the third portion 1413 to have a second length in parallel, substantially parallel, or within 5 degrees deviation of parallel, with the second portion 1412.

According to certain embodiments, at least one of the communication devices 900 and 900-1 may be disposed to an inner space 1401 of the electronic device 1400. According to an embodiment, at least one of the communication devices 900 and 900-1 may be disposed to at least one corner portion of the electronic device 1400 which has a rectangular shape, substantially rectangular shape (including a rectangular shape with rounded corners).

According to certain embodiments, a first lateral portion 9101 of the first communication device 900 may be adjacent to the first portion 1411 of the housing 910, and a second lateral portion 9102 of the first communication device 900 may be adjacent to the second portion 1412 of the housing 1410. In this case, the electrical connection member 950 (e.g., a power supply port and/or an RF port) of the communication device 900 may be pulled out toward a center of the electronic device 1400 at a fourth lateral portion 9104. For another example, the electrical connection member 950 may be pulled out toward the center of the electronic device 1400 at a third lateral portion 9103. According to an embodiment, the first lateral portion 9101 of the second communication device 900-1 may be adjacent to the fourth portion 1414 of the housing 1410, and the second lateral portion 9102 of the second communication device 900-1 may be adjacent to the first portion 1411 of the housing 1410.

According to certain embodiments, the first communication device 900 may form a beam pattern in a direction of a rear plate (e.g., the rear plate 211 of FIG. 2B) of the electronic device due to the plurality of antennas 920, 930, and 940 including conductive plates (e.g., second conductive plates 921, 931, and 941 and the second conductive plates 922, 932, and 942 of FIG. 9).

Referring to FIG. 14B, at least one of the communication devices 900, 900-1, and 900-2 may be disposed to some edge regions. According to an embodiment, the first communication device 900 may be disposed such that a second side (e.g., the second side 912 of FIG. 9) faces the first portion 1411 at a substantially center of the first portion 1411 of the housing 1410. According to an embodiment, when a second plate of the electronic device 1400 (e.g., the second plate 211 of FIG. 2B) is viewed from above, the first communication device 900 may be disposed such that the first lateral portion 9101 of the substrate 910 is in parallel with the first portion 1411 of the housing 1410. According to an embodiment, the second communication device 900-1 may be disposed in an adjacent and parallel manner with respect to the fourth portion 1411 in some regions of the fourth portion 1414 of the housing 1410. According to an embodiment, the third communication device 900-2 may be disposed in an adjacent and parallel manner with respect to the second portion 1412 in some regions of the second portion 1412 of the housing 1410.

According to certain embodiments, the first communication device 900 may form a beam pattern facing the first portion 1411 of the housing 1410 (e.g., facing a direction θ). According to an embodiment, the second communication device 900-1 may form a beam pattern facing the fourth portion 1414 of the housing 1410 (e.g., facing a direction θ). According to an embodiment, the third communication device 900-2 may form a beam pattern facing the second portion 1412 of the housing 1410 (e.g., facing a direction θ).

According to certain embodiments, although not shown, the communication device 900 may be disposed at each corner of the electronic device which has a substantially rectangular shape or at least some region of each edge, or may be disposed at both the corner and the edge.

According to certain embodiments, corresponding regions of the housing 1410 corresponding to a portion on which the communication devices 900, 900-1, and 900-2 are mounted may be constructed of a material (e.g., a dielectric material) other than a conductive material to prevent radiation performance deterioration of the communication device. However, without being limited thereto, the corresponding region of the housing 1410 may have a hole constructed on the housing in a beam-forming direction of the communication device, or may be replaced with a metallic periodic structure (e.g., a metal grid) through which a beam can pass.

According to certain embodiments, an electronic device comprises a housing, a substrate, and a wireless communication circuit. The housing (e.g., the housing 210 of FIG. 2A) comprises a first plate (e.g., the first plate 2011 of FIG. 2A) and a second plate (e.g., the second plate 211 of FIG. 2B) facing away from to the first plate. The substrate (e.g., the substrate 410 of FIG. 4C) is disposed between the first plate and the second plate and comprising a first side (e.g., the first side 411 of FIG. 4C) facing the first plate and a second side (e.g., the second side 412 of FIG. 4C) facing the second plate. The substrate further comprises a first conductive plate (e.g., the first conductive plate 421 of FIG. 4C) disposed on a first insulating layer (e.g. insulating layer 431) and facing the second side, a conductive pattern (e.g., conductive patter 423) disposed on a second insulating layer (e.g., insulating layer 432), wherein the second conductive layer is between the first conductive layer and the first side, a second conductive plate (e.g., second conductive plate 422) disposed on a third insulating layer (e.g., insulating layer 433) between the second insulating layer and the first side, and when the second plate is viewed from above the second side, the second plate at least partially overlaps with the first conductive plate, a ground plate (e.g., the ground plane 424) disposed on a fourth insulating layer (e.g., insulating layer 434), wherein the fourth insulating layer is between the third insulating layer and the first side, a conductive via (e.g., the conductive via 425 of FIG. 4C) constructed through the third and fourth insulating layers, and electrically connected with the conductive pattern; and a wireless communication circuit electrically (e.g., the wireless communication circuit 440 of FIG. 4C) connected with the conductive via, and configured to transmit/receive at least one signal having a frequency band in the range of 20 GHz to 100 GHz.

According to certain embodiments, the second insulating layer is immediately adjacent to the first insulating layer, the third insulating layer is immediately adjacent to the second insulating layer, and the fourth insulating layer is immediately adjacent to the third insulating layer, and wherein second conductive plate is disposed between the second insulating layer and the third insulating layer, and the ground plate is disposed between the third insulating layer and the fourth insulating layer.

According to certain embodiments, the second conductive plate may have a wider area than the first conductive plate.

According to certain embodiments, the conductive via constructed through the fourth insulating layer is surrounded by insulating material, thereby electrically disconnecting the conductive via from the ground plane.

According to certain embodiments, the wireless communication circuit transmits/receives a first signal having a first frequency through the first conductive plate and a second signal having a second frequency lower than the first frequency through the second conductive plate.

According to certain embodiments, the first frequency comprises a range of 35 GHz to 45 GHz.

According to certain embodiments, the second frequency comprises a range of 23 GHz to 33 GHz.

According to certain embodiments, the conductive pattern comprises a conductive line.

According to certain embodiments, an electronic device may include a housing (the housing 210 of FIG. 2A) including a first plate (e.g., the first plate 2011 of FIG. 2A), a second plate (e.g., the second plate 211 of FIG. 2B) facing away from the first plate, and a lateral member (the lateral member 216 of FIG. 2A) surrounding a space between the first plate and the second plate, a Printed Circuit Board (PCB) (e.g., the substrate 410 of FIG. 4C) disposed between the first plate and the second plate, and including a plurality of insulating layers (e.g., the insulating layers 431, 432, 433, and 434 of FIG. 4C) disposed in parallel with the second plate, a first conductive plate (e.g., the first conductive plate 421 of FIG. 4C) disposed on a first one of the plurality of insulating layers of the PCB, a second conductive plate (e.g., the second conductive plate 422 of FIG. 4C) overlapping with the first conductive plate, when the second plate is viewed from above the second plate, and disposed on a third one of the plurality of insulating layers of the substrate, a first conductive coupling member (e.g., the conductive coupling member 423 of FIG. 4C) disposed one a second on of the plurality of insulating layers between the first conductive plate and the second conductive plate, and a wireless communication circuit (e.g., the wireless communication circuit 440 of FIG. 4C) electrically connected with the first conductive coupling member configured to provide wireless communication.

According to certain embodiments the first conductive plate and the second conductive plate overlap to have a common center when viewed from above the second plate.

According to certain embodiments, the first conductive plate and the second conductive plate are constructed to have the same shape or different shapes, and the first conductive plate and the second conductive plate are constructed to have different sizes.

According to certain embodiments, the wireless communication circuit provides wireless communication in the range of 20 GHz to 100 GHz through the first conductive coupling member.

According to certain embodiments, the electronic device further comprises a third conductive plate disposed on a fourth one of the plurality of insulating layers and used as a ground plane, wherein the third conductive plate is disposed such that the second conductive plate is disposed between the first conductive coupling member and the third conductive plate.

According to certain embodiments, the electronic device further comprises a conductive connection member electrically connected with the first conductive coupling member through a through-hole constructed in the second plate from the wireless communication circuit.

According to certain embodiments the conductive connection member is disposed to be electrically disconnected from the second plate.

According to certain embodiments, the first conductive coupling member is constructed to have a specific width and length extended in a central direction from a feeding port to be coupled with the conductive connection member.

According to certain embodiments, the length and/or width of the first conductive coupling member are determined for impedance matching of the first conductive plate and/or the second conductive plate.

According to certain embodiments, the first conductive plate and the second conductive plate are symmetrical with respect to at least two virtual lines which pass through a center of the first conductive plate and the second conductive plate and are perpendicular to each other.

According to certain embodiments, a second conductive coupling member disposed at a location rotated by 90 degrees about the center as a rotational axis in the same insulating layer of the PBC having the first conductive coupling member disposed thereon.

According to certain embodiments, wherein the second conductive coupling member is disposed to be capacitively coupled with the first conductive plate and the second conductive plate to support dual polarization together with the first conductive coupling member.

Various exemplary embodiments of the present disclosure disclosed in the specification and the drawing are merely a specific example presented for clarity and are not intended to limit the scope of the present disclosure. Therefore, in addition to the embodiments disclosed herein, various changes in forms and details made without departing from the technical concept of the present disclosure will be construed as being included in the scope of the present disclosure.

What is claimed is:

1. An electronic device comprising:
a housing comprising a first plate and a second plate facing away from to the first plate; and
a substrate disposed between the first plate and the second plate and comprising a first side facing the first plate and a second side facing the second plate, wherein the substrate comprises:
a first conductive plate disposed on a first insulating layer and facing the second side;
a conductive pattern disposed on a second insulating layer, wherein the second insulating layer is between the first insulating layer and the first side;
a second conductive plate disposed on a third insulating layer between the second insulating layer and the first side, and when the second plate is viewed from above the second side, the second plate at least partially overlaps with the first conductive plate;
a ground plate disposed on a fourth insulating layer, wherein the fourth insulating layer is between the third insulating layer and the first side;
a conductive via constructed through the third and fourth insulating layers, and electrically connected with the conductive pattern;
wherein one or other or both of the first conductive plate and the second conductive plate are connected to the ground plate by way of respective conductive connection members;
wherein the at least one of the first conductive plate and the second conductive plate are configured to operate as a PIFA (planar inverted F antenna) structure; and
a wireless communication circuit electrically connected with the conductive via, and configured to transmit/receive at least one signal having a frequency band in a range of 20 GHz to 100 GHz.

2. The electronic device of claim 1, wherein the second insulating layer is immediately adjacent to the first insulating layer, the third insulating layer is immediately adjacent to the second insulating layer, and the fourth insulating layer is immediately adjacent to the third insulating layer, and wherein second conductive plate is disposed between the second insulating layer and the third insulating layer, and the ground plate disposed between the third insulating layer and the fourth insulating layer.

3. The electronic device of claim 1, wherein the second conductive plate has a wider area than the first conductive plate.

4. The electronic device of claim 1, wherein the conductive via constructed through the fourth insulating layer is surrounded by insulating material, thereby electrically disconnecting the conductive via from the ground plate.

5. The electronic device of claim 1, wherein the wireless communication circuit transmits/receives a first signal having a first frequency through the first conductive plate and a second signal having a second frequency lower than the first frequency through the second conductive plate.

6. The electronic device of claim 5, wherein the first frequency comprises a range of 35 GHz to 45 GHz.

7. The electronic device of claim 6, wherein the second frequency comprises a range of 23 GHz to 33 GHz.

8. The electronic device of claim 1, wherein the conductive pattern comprises a conductive line.

9. An electronic device comprising:
a housing comprising a first plate, a second plate facing away from the first plate, and a lateral member surrounding a space between the first plate and the second plate;
a Printed Circuit Board (PCB) disposed between the first plate and the second plate, and comprising a plurality of insulating layers disposed in parallel with the second plate;
a first conductive plate disposed on a first one of the plurality of insulating layers of the PCB;
a second conductive plate overlapping with the first conductive plate, when the second plate is viewed from above the second plate, and disposed on a third one of the plurality of insulating layers of the PCB;
wherein one or other or both of the first conductive plate and the second conductive plate are connected to a ground plate by way of respective conductive connection members;
wherein the at least one of the first conductive plate and the second conductive plate are configured to operate as a PIFA (planar inverted F antenna) structure;
a first conductive coupling member disposed on a second one of the plurality of insulating layers between the first conductive plate and the second conductive plate; and
a wireless communication circuit electrically connected with the first conductive coupling member configured to provide wireless communication.

10. The electronic device of claim 9, wherein the first conductive plate and the second conductive plate overlap to have a common center when viewed from above the second plate.

11. The electronic device of claim 10, wherein the first conductive plate and the second conductive plate are constructed to have a same shape or different shapes, and the first conductive plate and the second conductive plate are constructed to have different sizes.

12. The electronic device of claim 9, wherein the wireless communication circuit provides wireless communication in a range of 20 GHz to 100 GHz through the first conductive coupling member.

13. The electronic device of claim 9, further comprising a third conductive plate disposed on a fourth one of the plurality of insulating layers and used as a ground plane, wherein the third conductive plate is disposed such that the second conductive plate is disposed between the first conductive coupling member and the third conductive plate.

14. The electronic device of claim 9, further comprising a conductive via electrically connected with the first conductive coupling member through a through-hole constructed in the second plate from the wireless communication circuit.

15. The electronic device of claim 14, wherein the conductive via is disposed to be electrically disconnected from the second plate.

16. The electronic device of claim 14, wherein the first conductive coupling member is constructed to have a specific width and length extended in a central direction from a feeding port to be coupled with the conductive via.

17. The electronic device of claim 16, wherein a length or width of the first conductive coupling member are determined for impedance matching of the first conductive plate or the second conductive plate.

18. The electronic device of claim 9, wherein the first conductive plate and the second conductive plate are symmetrical with respect to at least two virtual lines which pass through a center of the first conductive plate and the second conductive plate and are perpendicular to each other.

19. The electronic device of claim 18, further comprising a second conductive coupling member disposed at a location forming a substantially 90 degree angle about the center as a rotational axis in a same insulating layer of the PCB having the first conductive coupling member disposed thereon.

20. The electronic device of claim 19, wherein the second conductive coupling member is disposed to be capacitively coupled with the first conductive plate and the second conductive plate to support dual polarization together with the first conductive coupling member.

* * * * *